US011166378B2

United States Patent
Beom et al.

(10) Patent No.: US 11,166,378 B2
(45) Date of Patent: *Nov. 2, 2021

(54) CARRIER-FOIL-ATTACHED ULTRA-THIN COPPER FOIL

(71) Applicant: Iljin Materials Co., Ltd., Jeollabuk-do (KR)

(72) Inventors: Won Jin Beom, Jeollabuk-do (KR); Sun Hyung Lee, Jeollabuk-do (KR); Eun Sil Choi, Jeollabuk-do (KR); Ki Deok Song, Jeollabuk-do (KR); Hyung Cheol Kim, Jeollabuk-do (KR)

(73) Assignee: ILJIN MATERIALS CO., LTD., Jeollabuk-Do (KR)

( * ) Notice: Subject to any disclaimer, the term of this patent is extended or adjusted under 35 U.S.C. 154(b) by 46 days.

This patent is subject to a terminal disclaimer.

(21) Appl. No.: 16/477,669

(22) PCT Filed: Jan. 15, 2018

(86) PCT No.: PCT/KR2018/000668
§ 371 (c)(1),
(2) Date: Jul. 12, 2019

(87) PCT Pub. No.: WO2018/131962
PCT Pub. Date: Jul. 19, 2018

(65) Prior Publication Data
US 2019/0364664 A1  Nov. 28, 2019

(30) Foreign Application Priority Data
Jan. 16, 2017 (KR) .................. 10-2017-0007042

(51) Int. Cl.
*B32B 15/00* (2006.01)
*H05K 3/02* (2006.01)
(Continued)

(52) U.S. Cl.
CPC .............. *H05K 3/025* (2013.01); *B32B 7/06* (2013.01); *B32B 15/01* (2013.01); *B32B 15/20* (2013.01);
(Continued)

(58) Field of Classification Search
None
See application file for complete search history.

(56) References Cited

U.S. PATENT DOCUMENTS

| 6,183,880 | B1 * | 2/2001 | Yoshioka | ................. C25D 1/04 148/264 |
| 2010/0282500 | A1 * | 11/2010 | Ryu | .................. C22C 27/04 174/257 |
| 2015/0068912 | A1 | 3/2015 | Tzou et al. | |

FOREIGN PATENT DOCUMENTS

| CN | 1251333 A | 4/2000 |
| CN | 1341962 A | 3/2002 |

(Continued)

*Primary Examiner* — Seth Dumbris
(74) *Attorney, Agent, or Firm* — Husch Blackwell LLP

(57) ABSTRACT

The carrier-foil-attached ultra-thin copper foil according to one embodiment of the present invention comprises a carrier foil, a release layer, a first ultra-thin copper foil, a Cu-diffusion prevention layer, an Al layer, and a second ultra-thin copper foil, wherein the release layer may comprise a first metal (A2) having peeling properties, and a second metal (B2) and third metal (C2) facilitating the plating of the first metal (A2).

12 Claims, 16 Drawing Sheets

(51) Int. Cl.
   *B32B 7/06*      (2019.01)
   *B32B 15/01*     (2006.01)
   *B32B 15/20*     (2006.01)

(52) U.S. Cl.
   CPC ... *B32B 2307/406* (2013.01); *B32B 2307/408* (2013.01); *B32B 2405/00* (2013.01); *H05K 2203/0152* (2013.01); *Y10T 428/12431* (2015.01)

(56) References Cited

FOREIGN PATENT DOCUMENTS

| | | | |
|---|---|---|---|
| CN | 105074058 A | | 11/2015 |
| JP | 2001196738 A | | 7/2001 |
| JP | 2003101197 A | * | 4/2003 |
| JP | 2004269959 A | | 9/2004 |
| KR | 20090072423 A | | 7/2009 |
| KR | 20100133665 A | | 12/2010 |
| KR | 20140023744 A | * | 2/2014 |
| KR | 20140023744 A | | 2/2014 |
| KR | 20140049632 A | | 4/2014 |
| TW | 200635000 A | | 10/2006 |
| WO | WO2016174970 A1 | | 11/2016 |

* cited by examiner

[FIG. 1]

[FIG. 2]
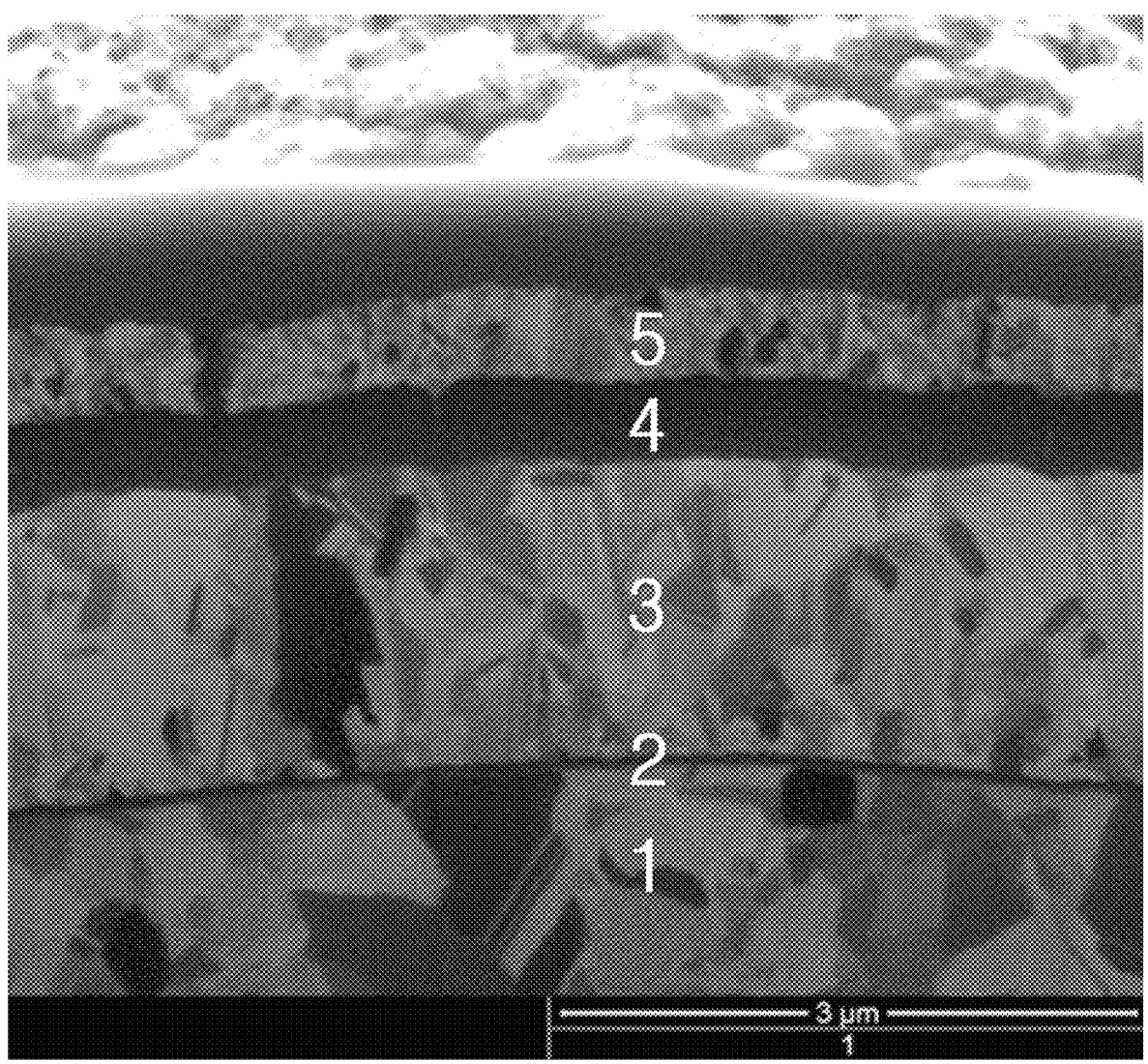

[FIG. 3]
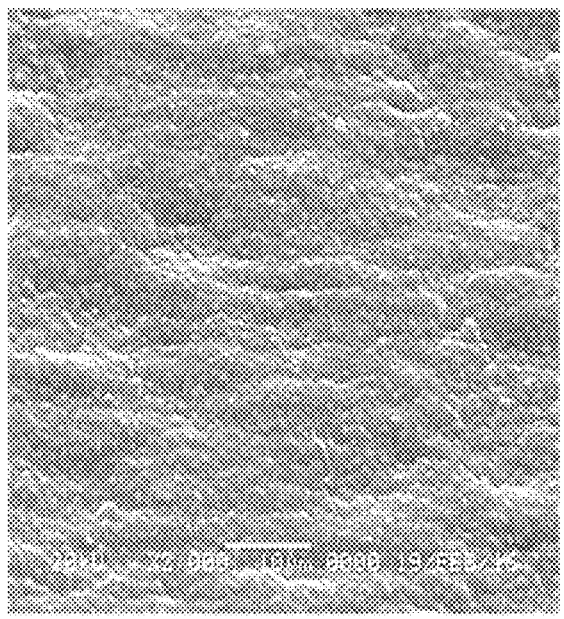 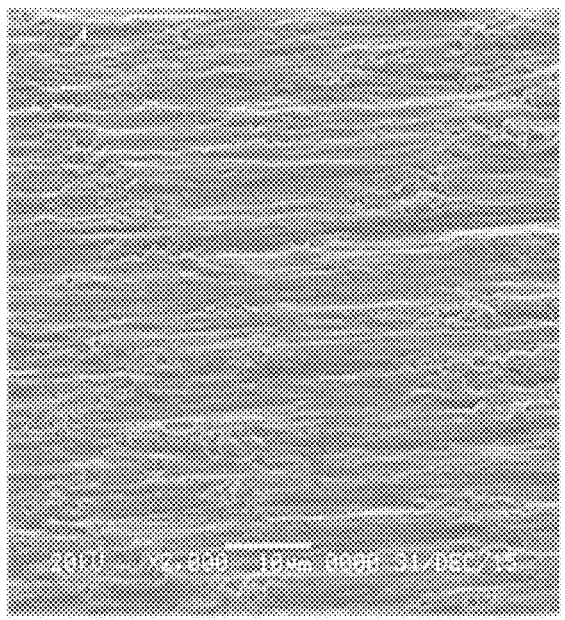
(a) (b)

[FIG. 4]
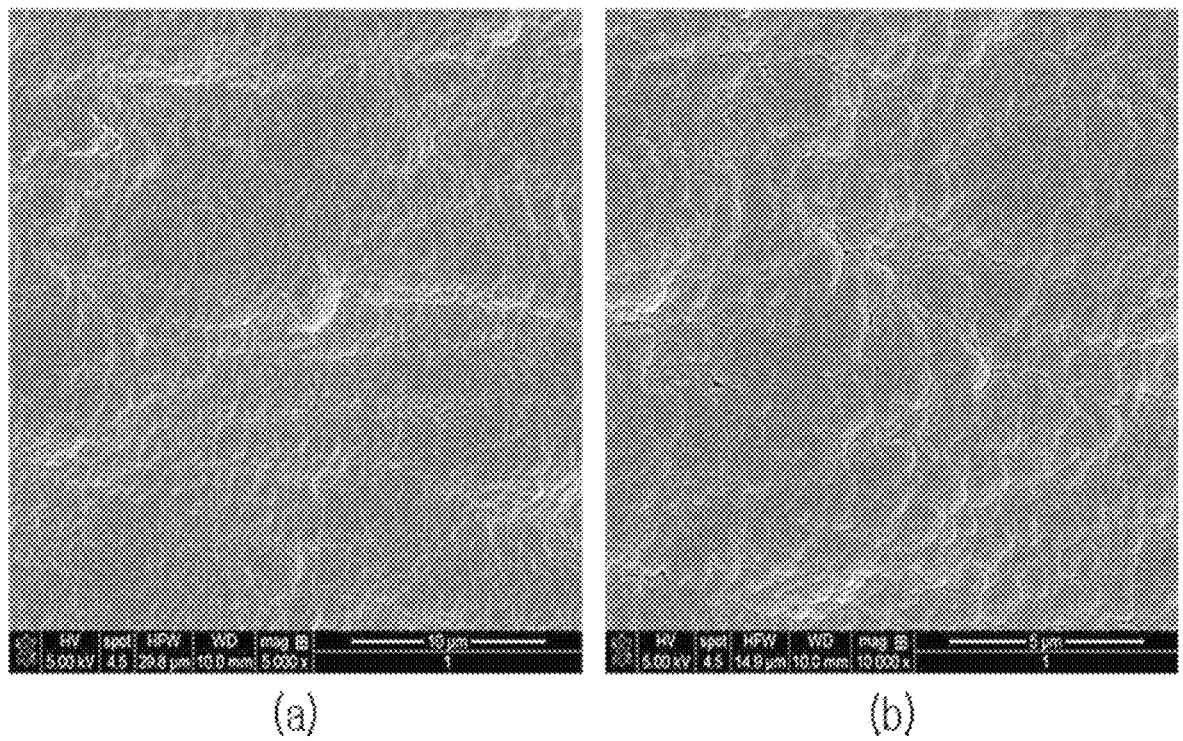
(a)                  (b)

[FIG. 5]
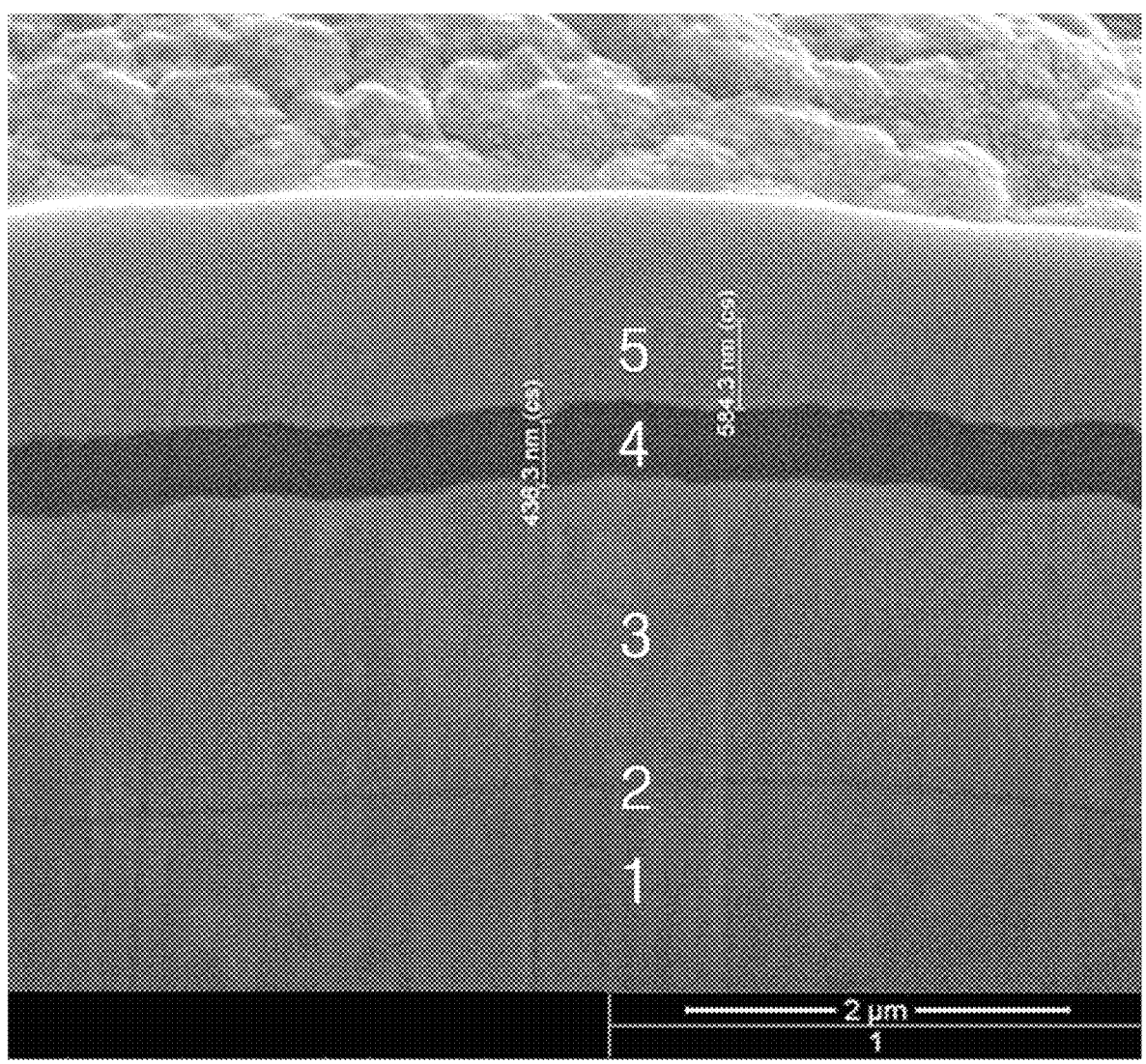

[FIG. 6]

[FIG. 7]
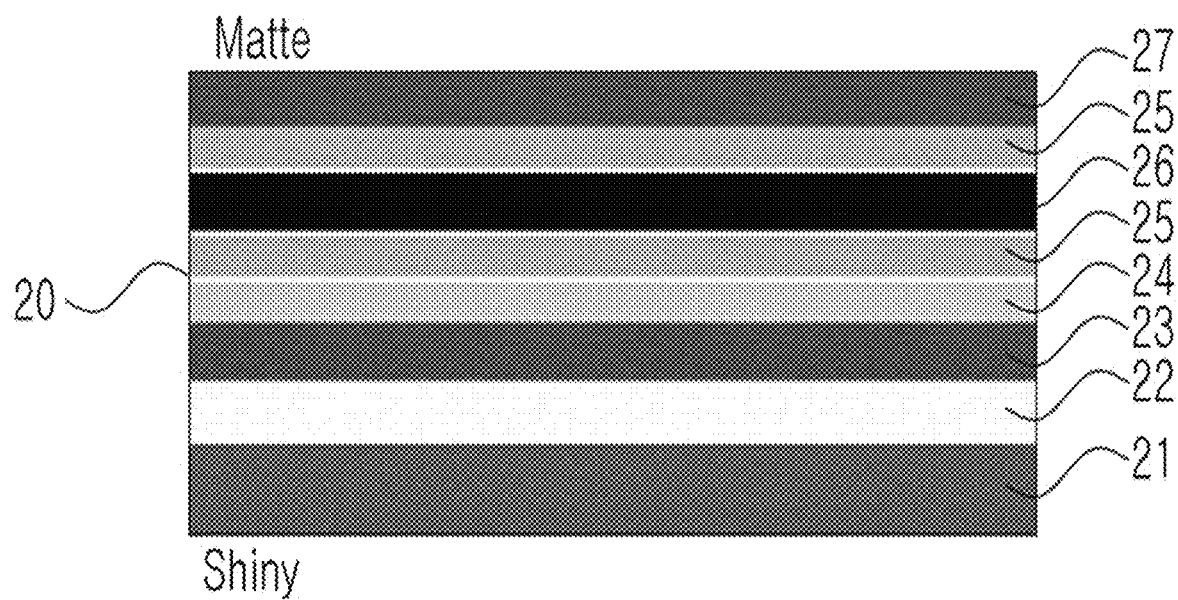

[FIG. 8]
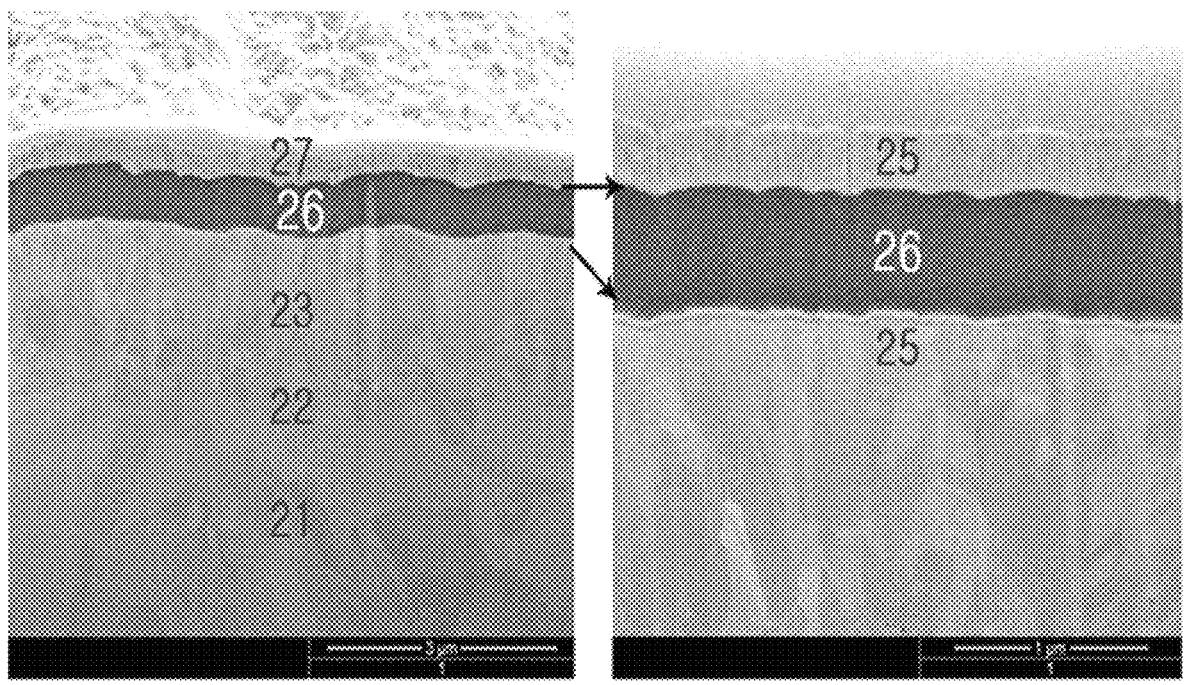

[FIG. 9]
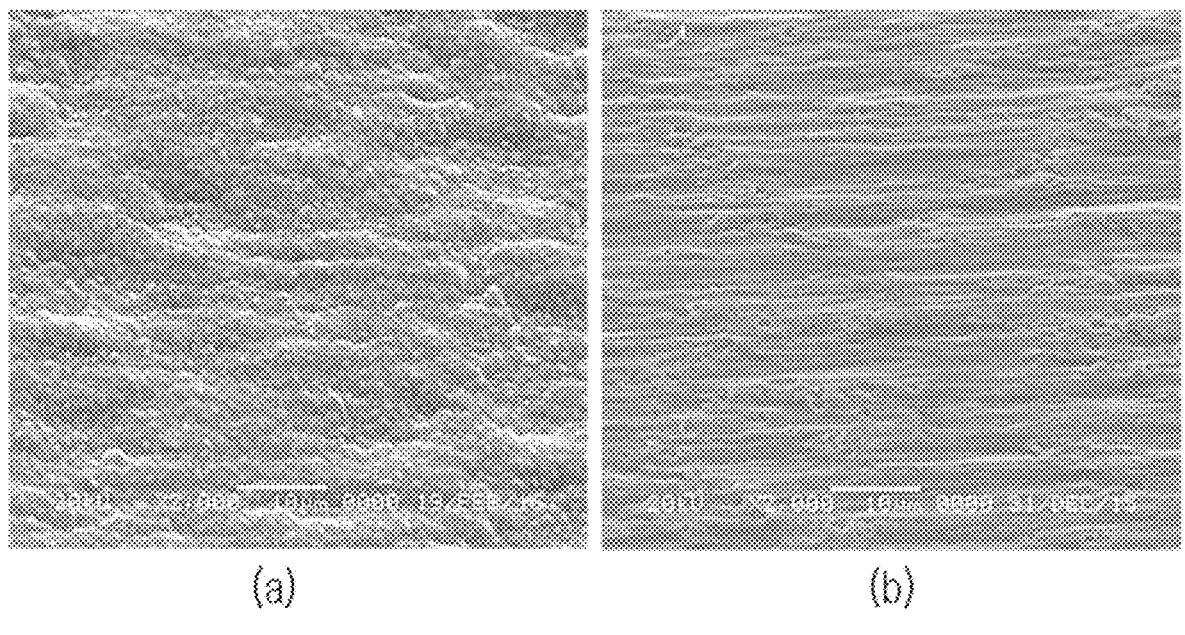
(a)  (b)

[FIG. 10]
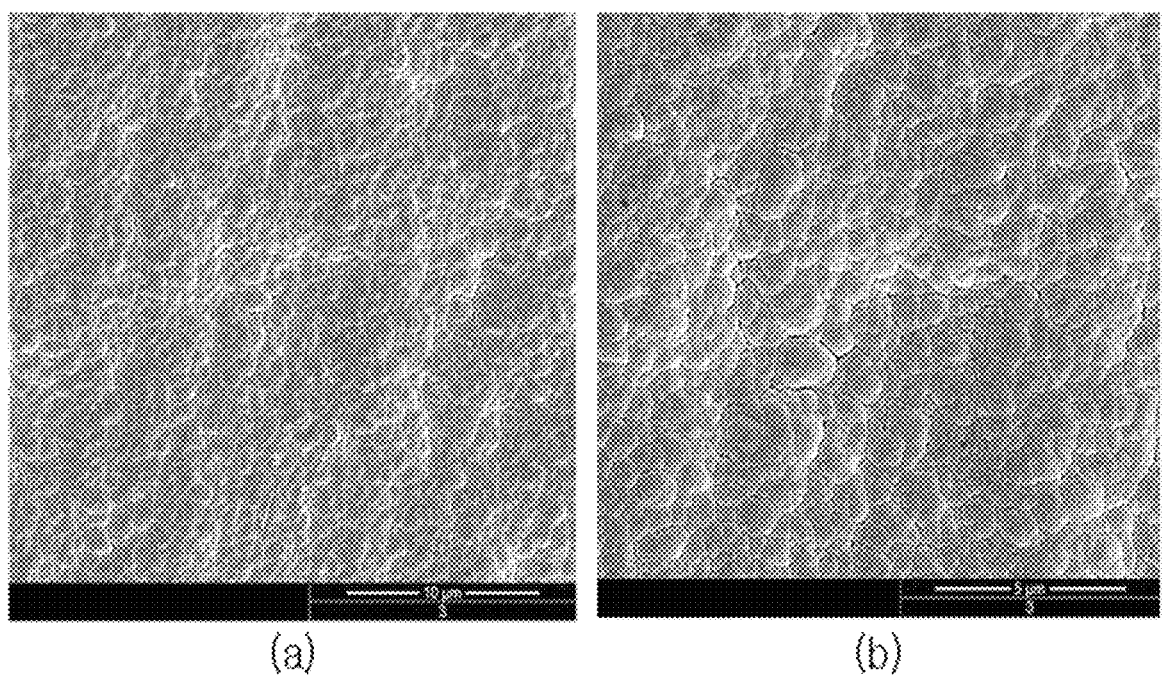
(a)　　　　　　　　　(b)

[FIG. 11]
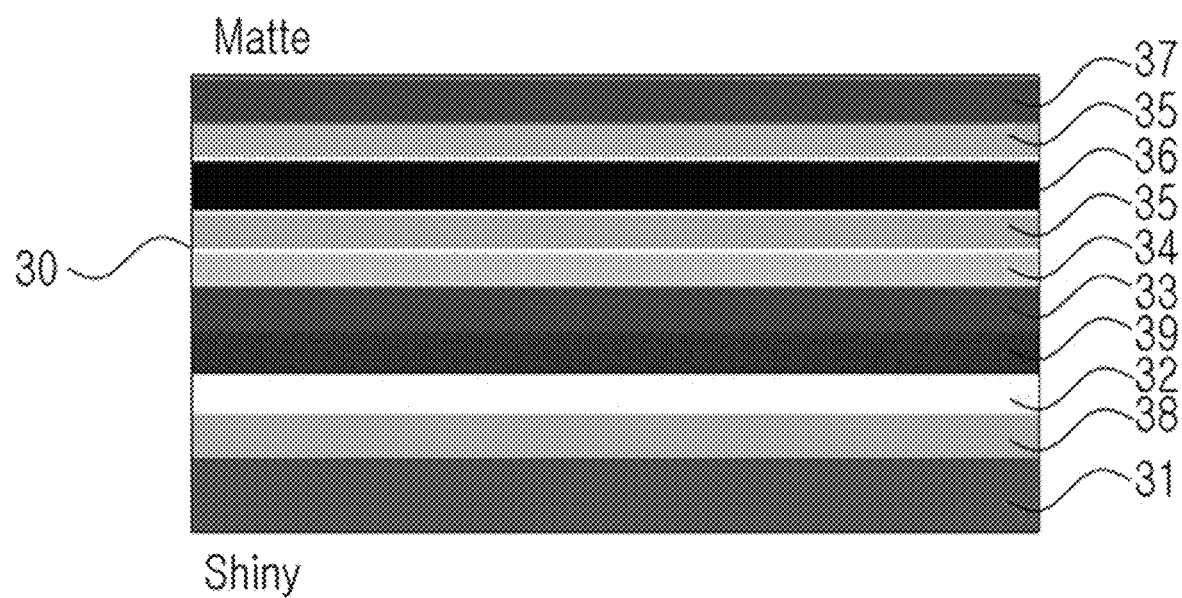

[FIG. 12]

[FIG. 13]
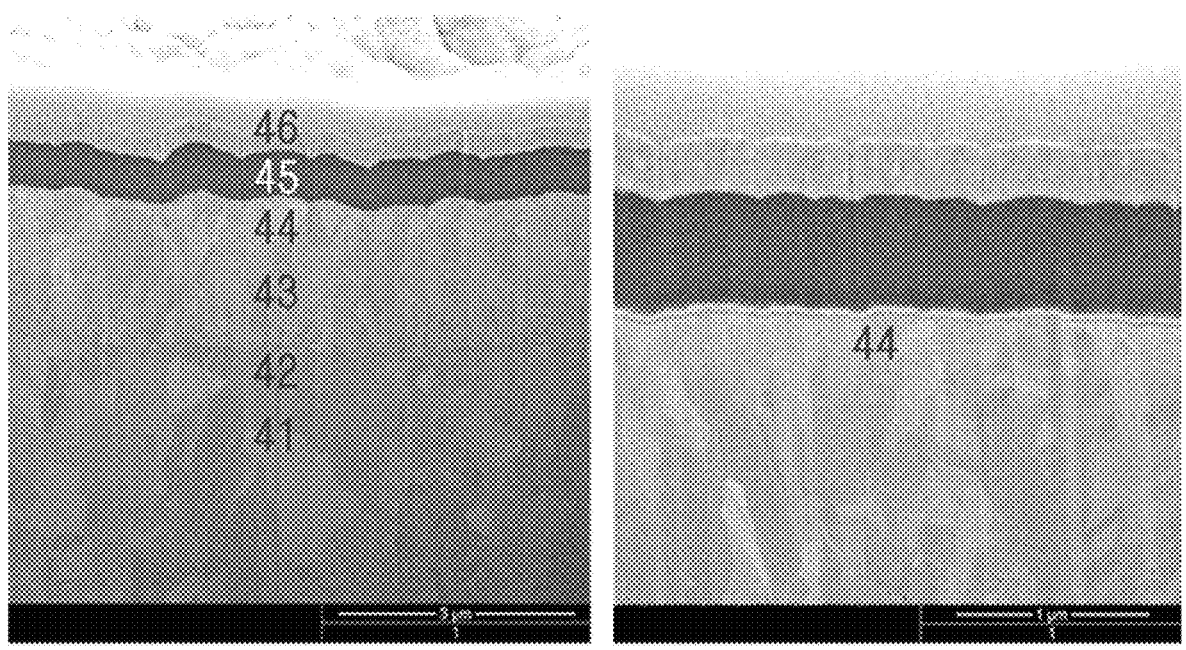

[FIG. 14]
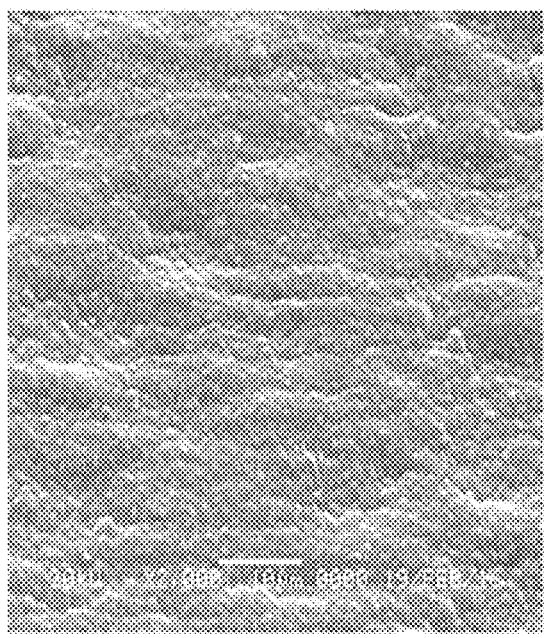 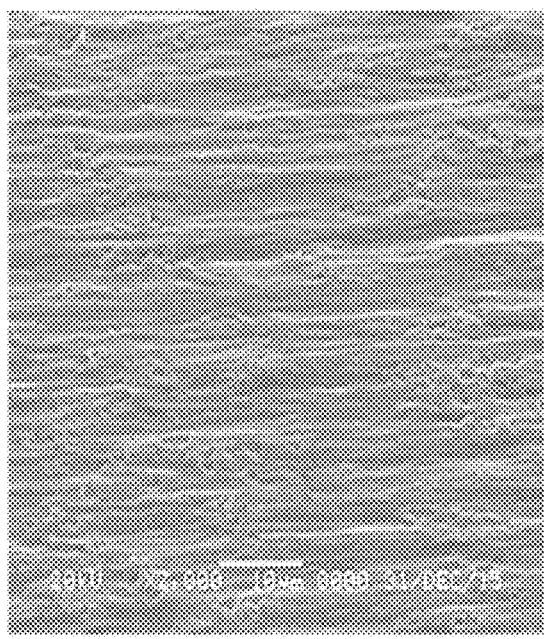
(a)          (b)

[FIG. 15]
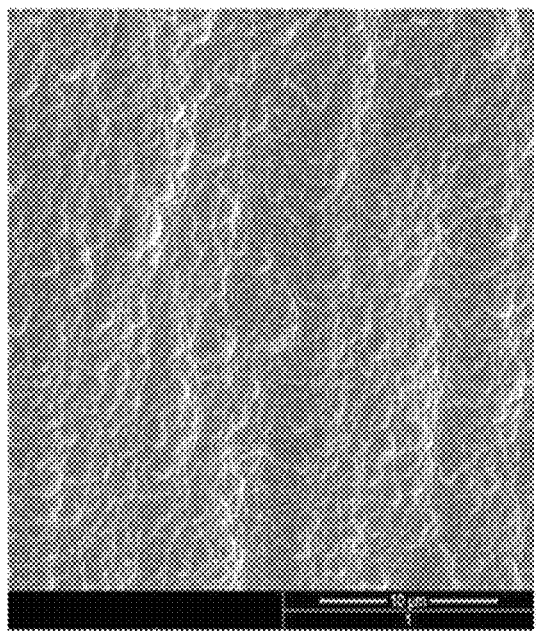
(a)
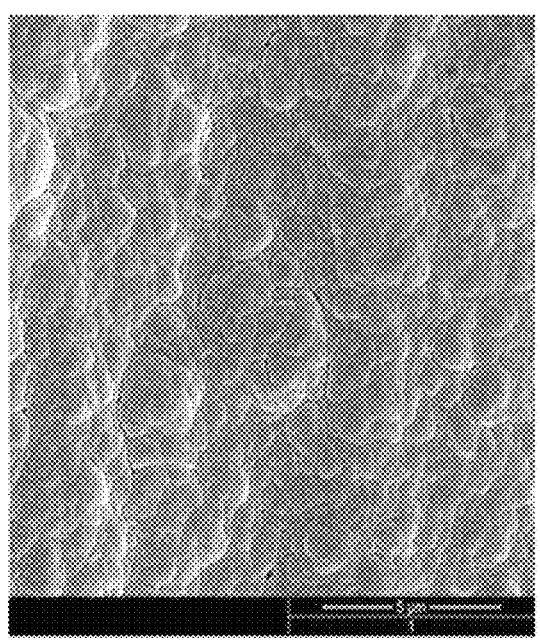
(b)

[FIG. 16]
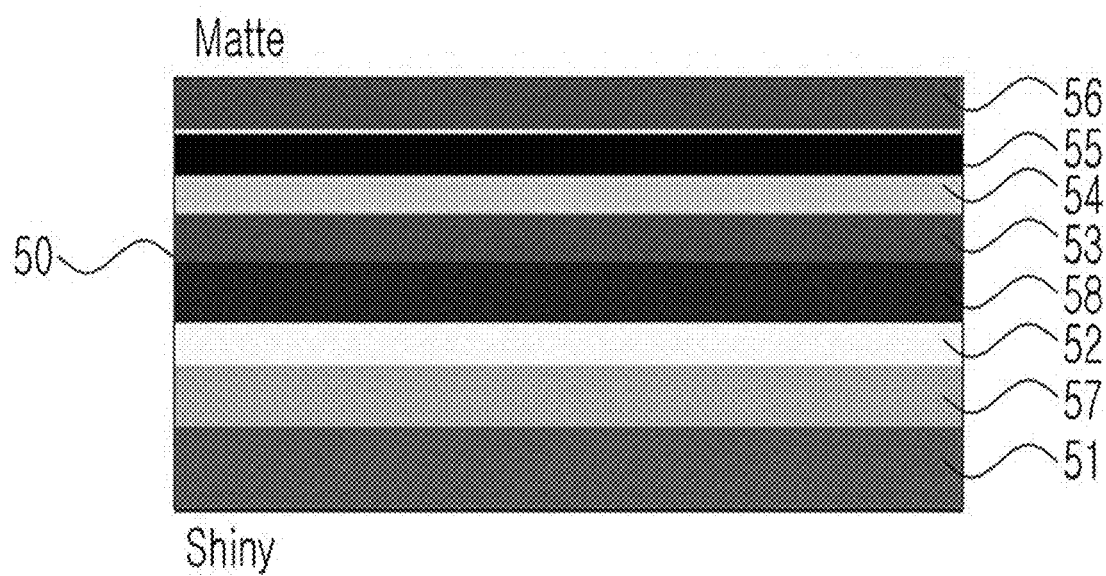

CARRIER-FOIL-ATTACHED ULTRA-THIN COPPER FOIL

CROSS REFERENCE TO RELATED APPLICATIONS

This application is a U.S. National Phase Application of International Application No. PCT/KR2018/000668 filed on Jan. 15, 2018, which claims the benefit of priority from Korean Patent Application 10-2017-0007042 filed on Jan. 16, 2017. The disclosures of International Application No. PCT/KR2018/000668 and Korean Patent Application 10-2017-0007042 are incorporated herein by reference.

TECHNICAL FIELD

The present invention relates to a carrier foil-attached ultra-thin copper foil, and more particularly, to a carrier foil-attached ultra-thin copper foil having a high bonding property with a wire of a printed circuit board.

BACKGROUND ART

Typically, wire bonding refers to a process of connecting input/output pads of a semiconductor chip and portions of leads or wiring patterns of a substrate (for example, lead frames or a printed circuit board) to each other to electrically connect the input/output pads of the semiconductor chip and the leads to each other.

In addition, in a package (PKG) printed circuit board, in order to minimize resistance to reduce power loss and improve conductivity, expensive metals, such as silver-palladium (Ag—Pd), are used for electrodes in a circuit at portions bonded to wires.

Here, Ag has high thermal conductivity and electrical conductivity among metals, and Pd is one of the platinum group metals, has ductility lower than that of platinum and malleability higher than that of platinum, and is cheaper and lighter than platinum to be used in various alloys, and thus an alloy of Ag and Pd, that is, Ag—Pd, is mainly used in a printed circuit board.

However, in a process using electrodes formed of Ag—Pd or the like, first, bonding pads are formed by screen-printing upper surfaces of a semiconductor chip and portions bonded with aluminum wires with a certain silver (Ag) paste, and the aluminum wires are attached to the bonding pads using an epoxy or the like and are cured to perform ultrasonic (wedge) bonding. However, in the conventional method (Korean Patent Publication No. 2014-0049632), a manufacturing process is complicated, and since pads are manufactured using a silver paste, manufacturing costs are increased, and manufacturing equipment is also expensive.

DISCLOSURE

Technical Problem

The present invention is directed to providing a carrier foil-attached ultra-thin copper foil having a high bonding property with a wire of a printed circuit board.

Technical Solution

According to an embodiment of the present invention, a carrier foil-attached ultra-thin copper foil includes a carrier foil, a release layer, a first ultra-thin copper foil, a copper (Cu)-aluminum (Al) bonding strength improvement layer, a Cu diffusion prevention layer, an Al layer, and a second ultra-thin copper foil, wherein the release layer includes a first metal (A2) having a peeling property and second and third metals (B2, C2) which facilitate plating of the first metal (A2).

According to an embodiment of the present invention, the Cu diffusion prevention layer may be formed between the Al layer and the first ultra-thin copper foil and between the Al layer and the second ultra-thin copper foil.

According to an embodiment of the present invention, the Cu—Al bonding strength improvement layer may be formed between the first ultra-thin copper foil and the Cu diffusion prevention layer.

According to an embodiment of the present invention, a thickness (t4) of the Al layer and a thickness (t5) of a bonding pad of a semiconductor chip may satisfy an expression of about $0.0005 \leq t4/t5 \leq$ about $3.0$.

According to an embodiment of the present invention, a thickness (t4) of the Al layer and a thickness (t6) of a bonding wire of a semiconductor chip may satisfy an expression of about $0.0005 \leq t4/t6 \leq$ about $3.0$.

According to an embodiment of the present invention, a thickness (t7) of the Cu diffusion prevention layer and a thickness (t4) of the Al layer may satisfy an expression of about $0.5 \leq t7/t4 \leq$ about $1.0$ According to an embodiment of the present invention, bonding strength p1 between the first ultra-thin copper foil and the Al layer or between the second ultra-thin copper foil and the Al layer and bonding strength p2 of the release layer may satisfy an equation of about $1 \leq p1/p2 \leq$ about $30.0$.

According to an embodiment of the present invention, a matte surface or a shiny surface of the carrier foil may have a surface roughness of about 3.0 μm or less, and the Al layer may be formed through electroplating or sputtering and may have a surface roughness of about 3.0 μm or less.

According to an embodiment of the present invention, the Al layer may be formed through electroplating or sputtering, and a surface roughness (r3) of a matte surface or a shiny surface of the carrier foil and a surface roughness (r4) of the Al layer may satisfy an expression of r4/r3 about 3.0.

According to an embodiment of the present invention, the first metal (A2) may be molybdenum (Mo) or tungsten (W), and the second and third metals (B2, C2) may be two different metals selected from the group consisting of iron (Fe), cobalt (Co), and nickel (Ni).

According to an embodiment of the present invention, in the release layer, a content (a2) of the first metal may range from 30 wt % to 89 wt %, a content (b2) of the second metal may range from 10 wt % to 60 wt %, and a content (c2) of the third metal may range from 1 wt % to 20 wt %.

According to an embodiment of the present invention, the sum of deposition amounts of the release layer may range from about 50 μg/dm² to about 10,000 μg/dm².

According to an embodiment of the present invention, the first ultra-thin copper foil and the second ultra-thin copper foil may be formed through electroplating or sputtering.

According to an embodiment of the present invention, at least one of the first, second, and third metals (A2, B2, C2) may be an organic metal.

According to an embodiment of the present invention, a carrier foil-attached ultra-thin copper foil includes a carrier foil, a diffusion prevention layer, a release layer, an oxidation prevention layer, a first ultra-thin copper foil, a copper (Cu)-aluminum (Al) bonding strength improvement layer, a Cu diffusion prevention layer, an Al layer, and a second ultra-thin copper foil, wherein the release layer includes a first metal (A2) having a peeling property and second and third metals (B2, C2) which facilitate plating of the first metal (A2), and the diffusion prevention layer and the oxidation prevention layer include at least one element selected from the group consisting of nickel (Ni), cobalt (Co), iron (Fe), chromium (Cr), molybdenum (Mo), tungsten (W), aluminum (Al), and phosphorus (P).

Advantageous Effects

According to the present invention, a wire bonding property between a chip and a substrate is excellent in a wire bonding process of a semiconductor package.

In addition, when a substrate is manufactured, a carrier foil-attached ultra-thin copper foil has excellent required characteristics of a copper foil, such as bonding strength, heat-resistant bonding strength, chemical resistance, and etch resistance.

DESCRIPTION OF DRAWINGS

FIG. 1 is a schematic cross-sectional view illustrating a carrier foil-attached ultra-thin copper foil according to a first embodiment of the present invention.

FIG. 2 shows a focused ion beam (FIB) image of a cross section of the carrier foil-attached ultra-thin copper foil according to the first embodiment of the present invention.

FIG. 3 shows surface images of a matte surface and a shiny surface when an Al layer is not formed.

FIG. 4 shows surface images of a matte surface and a shiny surface of the carrier foil-attached ultra-thin copper foil according to the first embodiment of the present invention.

FIG. 5 shows a FIB image of a cross section of the carrier foil-attached ultra-thin copper foil according to the first embodiment of the present invention.

FIG. 6 is a schematic cross-sectional view according to another example of a carrier foil-attached ultra-thin copper foil according to the first embodiment of the present invention.

FIG. 7 is a schematic cross-sectional view illustrating a carrier foil-attached ultra-thin copper foil according to a second embodiment of the present invention.

FIG. 8 shows a FIB image of a cross section of the carrier foil-attached ultra-thin copper foil according to the second embodiment of the present invention.

FIG. 9 shows surface images of a matte surface and a shiny surface when an Al layer is not formed.

FIG. 10 shows surfaces images of a matte surface and a shiny surface of the carrier foil-attached ultra-thin copper foil according to the second embodiment of the present invention.

FIG. 11 is a schematic cross-sectional view according to another example of a carrier foil-attached ultra-thin copper foil according to the second embodiment of the present invention.

FIG. 12 is a schematic cross-sectional view illustrating a carrier foil-attached ultra-thin copper foil according to a third embodiment of the present invention.

FIG. 13 shows a FIB image of a cross section of the carrier foil-attached ultra-thin copper foil according to the third embodiment of the present invention.

FIG. 14 shows surface images of a matte surface and a shiny surface when an Al layer is not formed.

FIG. 15 shows surfaces images of a matte surface and a shiny surface of the carrier foil-attached ultra-thin copper foil according to the third embodiment of the present invention.

FIG. 16 is a schematic cross-sectional view according to another example of the carrier foil-attached ultra-thin copper foil according to the third embodiment of the present invention.

MODES OF THE INVENTION

Hereinafter, specific embodiments of the present invention will be described in detail with reference to the accompanying drawings. Meanwhile, the spirit of the present invention is not limited to the suggested embodiments, and those skilled in the art to which the present invention pertains could easily suggest a further retrogressive invention or another embodiment which falls within the spirit of the present invention through the addition, modification, and deletion of another component without departing from the spirit of the present invention.

The same reference numerals will be used throughout to designate the same or like components having the same function within the same scope shown in the drawings of the embodiments.

The present invention provides a copper foil for a printed circuit board, which improves bonding strength between a wire of a printed circuit board and the printed circuit board and concurrently simplifies a manufacturing process of a semiconductor substrate, thereby reducing a manufacturing time to increase yield and considerably reducing manufacturing costs.

Typically, wire bonding refers to a process of connecting an input/output pad of a semiconductor chip and a portion of a lead or a wiring pattern of a substrate (for example, a lead frame or a printed circuit board) to each other to electrically connect the input/output pad of the semiconductor chip and the lead to each other.

Conventionally, in a package (PKG) printed circuit board, in order to minimize resistance to reduce power dissipation and improve conductivity, expensive metals, such as silver-palladium (Ag—Pd), have been used for an electrode in a circuit at a portion bonded to a wire.

Here, Ag has high thermal conductivity and electrical conductivity among metals, and Pd is one of platinum metals, has ductility lower than that of platinum and malleability higher than that of platinum, and is cheaper and lighter than platinum to be used in various alloys, and thus an alloy of Ag and Pd, that is, Ag—Pd, is mainly used in a printed circuit board.

However, in a process using an electrode formed of Ag—Pd, first, a bonding pad is formed by screen-printing upper surfaces of a semiconductor chip and a portion bonded to an aluminum wire with a certain silver (Ag) paste, and the aluminum wire is attached to the bonding pad using an epoxy or the like and is cured to perform ultrasonic (wedge) bonding. However, in such a conventional method, a manufacturing process is complicated, and since the pad is manufactured using the silver paste, manufacturing costs are increased, and manufacturing equipment is also expensive.

Hereinafter, in carrier-attached ultra-thin copper foils according to embodiments of the present invention, an ultra-thin copper foil is provided which improves a wire bonding property between a semiconductor chip and a substrate in a wire bonding process of a semiconductor package due to an aluminum (Al) layer being formed and has excellent required characteristics of a copper foil, such as bonding strength, heat-resistant bonding strength, chemical resistance, and etch resistance when a substrate is manufactured.

First Embodiment

FIG. 1 is a schematic cross-sectional view illustrating a carrier foil-attached ultra-thin copper foil according to a first embodiment of the present invention. FIG. 2 shows a focused ion beam (FIB) image of a cross section of the carrier foil-attached ultra-thin copper foil according to the first embodiment of the present invention. FIG. 3 shows surface images of a matte surface and a shiny surface when an Al layer is not formed.

FIG. 4 shows surface images of a matte surface and a shiny surface of the carrier foil-attached ultra-thin copper foil according to the first embodiment of the present invention. FIG. 5 shows a FIB image of a cross section of the carrier foil-attached ultra-thin copper foil according to the first embodiment of the present invention.

FIG. 6 is a schematic cross-sectional view according to another example of the carrier foil-attached ultra-thin copper foil according to the first embodiment of the present invention.

Referring to FIGS. 1 to 5, a carrier foil-attached ultra-thin copper foil 100 according to the first embodiment of the present invention may include a carrier foil 1, a release layer 2, a first ultra-thin copper foil 3, an Al layer 4, and a second ultra-thin copper foil 5.

The carrier foil-attached ultra-thin copper foil 100 may be formed by sequentially stacking the release layer 2, the first ultra-thin copper foil 3, the Al layer 4, and the second ultra-thin copper foil 5 on the carrier foil 1.

An aluminum foil, a stainless steel foil, a titanium foil, a copper foil, or a copper alloy foil may be used as the carrier foil 1. For example, an electrolytic copper foil, an electrolytic copper alloy foil, a rolled copper foil, or a rolled copper alloy foil may be used.

A surface of the carrier foil 1 may be a matte surface or a shiny surface of an untreated electrolytic copper foil or an untreated electrolytic copper alloy foil or a roll finished surface of a rolled copper foil or a rolled copper alloy foil. For example, the carrier foil may be a foil in which a matte surface or a shiny surface of an untreated electrolytic copper foil or an untreated electrolytic copper alloy foil is subjected to roughening treatment or a foil in which at least one surface of roll finished surfaces of a rolled copper foil or a rolled copper alloy foil is subjected to roughening treatment.

At least one of the first ultra-thin copper foil 3 and the second ultra-thin copper foil 5 may be formed through electroplating, electroless plating, or sputtering.

The first ultra-thin copper foil 3 may be formed through electroplating, and the second ultra-thin copper foil 5 may be formed through sputtering.

The release layer 2 may include a first metal A1 having a peeling property, and a second metal B1 and a third metal C1 which facilitate plating of the first metal A1.

The first metal A1 may be molybdenum (Mo) or tungsten (W), and the second metal B1 and the third metal C1 may be two different metals selected from the group consisting of iron (Fe), cobalt (Co), and nickel (Ni).

Here, at least one of the first metal A1, the second metal B1, and the third metal C1 may be an organic metal.

In the release layer 2, a content a1 of the first metal A1 may range from about 30 wt % to about 89 wt %, a content b1 of the second metal B1 may range from 10 wt % to about 60 wt %, and a content c1 of the third metal C1 may range from 1 wt % to about 20 wt %.

Each of the contents a1, b1, and c1 of the metals is obtained by dividing a deposition amount (coating amount) of the first metal A1 per unit area of 1 dm$^2$ of the release layer 2 by the sum of deposition amounts (coating amounts) of the first metal A1, the second metal B1, and the third metal C1 per the same area as the unit area and multiplying the obtained value by 100.

When the content a1 of the first metal and the content b1 of the second metal deviate from the content ranges, a peeling property of the ultra-thin copper foil may be lowered. When the content c1 of the third metal deviates from the content range, the release layer may be non-uniformly plated.

When the release layer includes only the first metal A1 and the second metal B1, a peeling property of the release layer may be non-uniform.

In addition, when the release layer is peeled off, the release layer may exhibit a tendency to be peeled off together with the ultra-thin copper foil.

On the other hand, in the present invention, when the release layer includes only the first metal A1 and the second metal B1 (for example, a Mo—Ni alloy layer), a peeling property of the release layer becomes unstable. Thus, in order to increase a plating amount of the first metal A1, i.e., a Mo metal that is a main factor of a peeling property of the release layer, Fe ions serving as a catalyst for plating the Mo metal are further added as the third metal C1. The addition of Fe ions enables the release layer to be uniformly plated.

In addition, the sum of deposition amounts of the release layer may be in a range of about 50 µg/dm$^2$ to about 10,000 µg/dm$^2$.

When the deposition amount is less than about 50 µg/dm$^2$, the release layer may not serve as a release layer. When the deposition amount exceeds about 10,000 µg/dm$^2$, the release layer may become a metallic material rather than an oxidizing material that is a peelable material and thus may lose a peeling property.

On the other hand, a thickness t1 of the Al layer and a thickness t2 of a bonding pad of a semiconductor chip satisfy an expression of about $0.0005 \leq t1/t2 \leq$ about 3.0. A ratio t1/t2 of the thickness of the Al layer to the thickness of the bonding pad of the semiconductor chip may be implemented in a range of about 0.0005 to about 3.0, thereby obtaining a more excellent effect.

In a specific example, the ratio t1/t2 of the thickness of the Al layer to the thickness of the bonding pad of the semiconductor chip may be about 0.0005, 0.001, 0.01, 0.1, 0.2, 0.3, 0.4, 0.5, 0.6, 0.7, 0.8, 0.9, 1.0, 1.5, 2.0, 2.5, or 3.0. The ratio t1/t2 of the thickness of the Al layer to the thickness of the bonding pad of the semiconductor chip may range approximately from one of the numerical values set forth above to another one of the numerical values set forth above.

In addition, the thickness t1 of the Al layer and a thickness t3 of a bonding wire of the semiconductor chip satisfy an expression of about $0.0005 \leq t1/t3 \leq$ about 3.0. A ratio t1/t3 of the thickness of the Al layer to the thickness of the bonding pad of the semiconductor chip may be implemented in a range of about 0.0005 to about 3.0, thereby obtaining a more excellent effect.

In a specific example, the ratio t1/t3 of the thickness of the Al layer to the thickness of the bonding wire of the semiconductor chip may be about 0.0005, 0.001, 0.01, 0.1, 0.2, 0.3, 0.4, 0.5, 0.6, 0.7, 0.8, 0.9, 1.0, 1.5, 2.0, 2.5, or 3.0. In addition, the ratio t1/t2 of the thickness of the Al layer to the thickness of the bonding wire of the semiconductor chip may range approximately from one of the numerical values set forth above to another one of the numerical values set forth above.

Meanwhile, the matte surface or the shiny surface of the carrier foil 1 may have a surface roughness of about 2.0 µm or less. The Al layer is formed through electroplating or sputtering and has a surface roughness of about 2.0 μm or less.

In addition, a surface roughness r1 of the matte surface or the shiny surface of the carrier foil and a surface roughness r2 of the Al layer satisfy an expression of r2/r1≤about 3.0. A ratio r2/r1 of the surface roughness of the Al layer to the surface roughness of the matte surface or the shiny surface of the carrier foil may be implemented in a range of about 3.0 or less, thereby obtaining a more excellent effect.

In a specific example, the ratio r2/r1 of the surface roughness of the Al layer to the surface roughness of the matte surface or the shiny surface of the carrier foil may be about 0, 0.1, 0.2, 0.3, 0.4, 0.5, 0.6, 0.7, 0.8, 0.9, 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, or 3.0. In addition, the ratio r2/r1 of the surface roughness of the Al layer to the surface roughness of the matte surface or the shiny surface of the carrier foil may range approximately from one of the numerical values set forth above to another one of the numerical values set forth above.

Referring to FIG. 6, a carrier foil-attached ultra-thin copper foil 10 according to another embodiment of the present invention may further include a diffusion prevention layer 16 and an oxidation prevention layer 17 added to the carrier foil-attached ultra-thin copper foil 100.

Specifically, the carrier foil-attached ultra-thin copper foil 10 may be formed by sequentially stacking the diffusion prevention layer 16, a release layer 12, the oxidation prevention layer 17, a first ultra-thin copper foil 13, an Al layer 14, and a second ultra-thin copper foil 15 on a carrier foil 11.

The diffusion prevention layer 16 and the oxidation prevention layer 17 are formed using the same plating condition and thus have substantially the same composition. However, since a metal deposition amount of the diffusion prevention layer 16 is increased as compared with the oxidation prevention layer 17, the diffusion prevention layer 16 is thicker than the oxidation prevention layer 17.

Due to the presence of the diffusion prevention layer 16 in the carrier foil-attached ultra-thin copper foil 10, peel strength of the carrier foil and the ultra-thin copper foil is maintained at a constant low value even in a high temperature processing environment, and thus, the carrier foil and the ultra-thin copper foil are easily peeled off.

In addition, the oxidation prevention layer 17 may be thinner than the diffusion prevention layer 16 in the carrier foil-attached ultra-thin copper foil 10, and thus, stable peel strength, high corrosion resistance of the oxidation prevention layer 17, and improved laser processability may be implemented at the same time.

Furthermore, the diffusion prevention layer 16 and the oxidation prevention layer 17 may use substantially the same plating solution in the carrier foil-attached ultra-thin copper foil 10, thereby simplifying a manufacturing process.

The diffusion prevention layer 16 and the oxidation prevention layer 17 may include at least one element selected from the group consisting of nickel (Ni), cobalt (Co), iron (Fe), chromium (Cr), molybdenum (Mo), tungsten (W), aluminum (Al), and phosphorus (P). For example, the diffusion prevention layer and the oxidation prevention layer may each be a single metal layer, an alloy layer made of two or more metals, or a metal oxide layer made of one or more metals.

For example, plating for forming a single metal layer may include nickel plating, cobalt plating, iron plating, aluminum plating, and the like. Plating for forming a binary alloy layer may include nickel-cobalt plating, nickel-iron plating, nickel-chromium plating, nickel-molybdenum plating, nickel-tungsten plating, nickel-copper plating, nickel-phosphorous plating, cobalt-iron plating, cobalt-chromium plating, cobalt-molybdenum plating, cobalt-tungsten plating, cobalt-copper plating, and cobalt-phosphorous plating. Plating for forming a ternary alloy layer may include nickel-cobalt-iron plating, nickel-cobalt-chromium plating, nickel-cobalt-molybdenum plating, nickel-cobalt-tungsten plating, nickel-cobalt-copper plating, nickel-cobalt-phosphorous plating, nickel-iron-chromium plating, nickel-iron-molybdenum plating, nickel-iron-tungsten plating, nickel-iron-copper plating, nickel-iron-phosphorous plating, nickel-chromium-molybdenum plating, nickel-chromium-tungsten plating, nickel-chromium-copper plating, nickel-chromium-phosphorus plating, nickel-molybdenum-tungsten plating, nickel-molybdenum-copper plating, nickel-molybdenum-phosphorous plating, nickel-tungsten-copper plating, nickel-tungsten-phosphorous plating, nickel-copper-phosphorous plating, cobalt-iron-chromium plating, cobalt-iron-molybdenum plating, cobalt-iron-tungsten plating, cobalt-iron-copper plating, cobalt-iron-phosphorous plating, cobalt-chromium-molybdenum plating, cobalt-chromium-tungsten plating, cobalt-chromium-copper plating, cobalt-chromium-phosphorous plating, cobalt-molybdenum-phosphorous plating, cobalt-tungsten-copper plating, cobalt-molybdenum-phosphorous plating, cobalt-tungsten-copper plating, cobalt-tungsten-phosphorous plating, and cobalt-copper-phosphorous plating.

For example, the diffusion prevention layer and the oxidation prevention layer may include Ni and P.

In addition, an oxide may include nickel oxide, cobalt oxide, iron oxide, chromium oxide, molybdenum oxide, tungsten oxide, copper oxide, aluminum oxide, phosphorus oxide, and the like. Furthermore, a mixture of two or more of the above oxides and the like may be used.

In addition, a layer selected from a plating layer made of a single metal, an alloy plating layer, and an oxide layer may be formed as two or more layers.

The diffusion prevention layer may serve to prevent copper from being diffused into the release layer when the carrier foil-attached ultra-thin copper foil is pressed at a high temperature together with an insulating substrate. When the carrier foil-attached ultra-thin copper foil is pressed at a high temperature together with the insulating substrate without forming the diffusion preventing layer, copper may be diffused from the carrier foil and the ultra-thin copper foil to the release layer to form metallic binding between the carrier foil and the ultra-thin copper foil. It may be difficult to peel the carrier foil therefrom due to a strong binding force between the carrier foil and the ultra-thin copper foil.

Hereinafter, the present invention will be described in detail with reference to exemplary embodiments but is not limited thereto.

(Manufacture of Carrier Foil-Attached Ultra-Thin Copper Foil)

Example 1

1. Formation of Carrier Foil

A carrier foil had a surface roughness of 1.5 μm, and an electrolytic copper foil having a thickness of 18 μm was used.

2. Formation of Diffusion Prevention Layer

A diffusion prevention layer was formed through Ni—P plating under the following conditions.

Ni concentration: 15 g/L, P concentration: 8 g/L
pH 4.0 temperature: 30° C.
current density: 1.5 A/dm$^2$
plating time: 2 seconds

A deposition amount of the diffusion prevention layer formed under the above conditions was a metal (Ni) deposition amount of 301 μg/dm$^2$.

3. Formation of Release Layer

A release layer was formed through Mo—Ni—Fe plating under the following conditions.

Mo concentration: 20 g/L, Ni concentration: 6.5 g/L
Fe concentration: 3 g/L, sodium citrate: 150 g/L
pH 10.2 (30 ml/L of ammonia water added)
temperature: 30° C.
current density: 10 A/dm$^2$
plating time: 7 seconds A deposition amount of the release layer formed under the above conditions was 1.07 mg/dm$^2$, and a composition of the release layer included 60.55 wt % Mo, 29.8 wt % Ni, and 5.99 wt % Fe.

4. Formation of Oxidation Prevention Layer

An oxidation prevention layer was formed through Ni—P plating under the following conditions.

Ni concentration: 15 g/L, P concentration: 8 g/L
pH 4.0
temperature: 30° C.
current density: 0.5 A/dm$^2$
plating time: 2 seconds A deposition amount of the oxidation prevention layer formed under the above conditions was a metal (Ni) deposition amount of 30 μg/dm$^2$.

5. Formation of First Ultra-Thin Copper Foil

A first ultra-thin copper foil was formed under the following conditions.

CuSO$_4$-5H$_2$O: 300 g/L, H$_2$SO$_4$: 150 g/L
temperature: 30° C.
current density: 20 A/dm$^2$
plating time: 25 seconds A thickness of the first ultra-thin copper foil formed under the above conditions was 2 μm.

6. Formation of Al Layer

A thickness of an Al layer, that is, a wire bonding layer, was 0.5 μm, and a surface roughness thereof was 1.5 μm, which is the same as a roughness of the carrier foil.

7. Formation of second ultra-thin copper foil

A second ultra-thin copper foil was formed under the following conditions.

CuSO$_4$-5H$_2$O: 300 g/L, H$_2$SO$_4$: 150 g/L
temperature: 30° C.
current density: 20 A/dm$^2$
plating time: 5 seconds A thickness of the second ultra-thin copper foil formed under the above conditions was 0.5 μm.

Example 2

Example 2 was obtained under the same conditions as Example 1 except that an Al layer was changed as follows.

6. Formation of Al Layer

A thickness of an Al layer, that is, a wire bonding layer, was 1.0 μm, and a surface roughness thereof was 1.5 μm, which is the same as a roughness of a carrier foil.

Example 3

Example 3 was obtained under the same conditions as Example 1 except that a carrier foil and an Al layer were changed as follows.

1. Formation of Carrier Foil

A carrier foil had a surface roughness of 3.0 μm, and an electrolytic copper foil having a thickness of 18 μm was used.

6. Formation of Al Layer

A thickness of an Al layer, that is, a wire bonding layer, was 0.5 μm, and a surface roughness thereof was 3.0 μm, which is the same as a roughness of the carrier foil.

Example 4

Example 4 was obtained under the same conditions as Example 1 except that a release layer was changed as follows 4. Formation of Release Layer A release layer was formed through Mo—Ni—Fe plating under the following conditions.

Mo concentration: 20 g/L Ni concentration: 6.5 g/L
Fe concentration: 3 g/L, sodium citrate: 150 g/L
pH 10.2 (30 ml/L of ammonia water added)
temperature: 30° C.
current density: 18 A/dm$^2$
plating time: 7 seconds A deposition amount of the release layer formed under the above conditions was 1.89 mg/dm$^2$, and a composition of the release layer included 51.99 wt % Mo, 38.8 wt % Ni, and 5.55 wt % Fe.

Comparative Example 1

Comparative Example 1 was obtained under the same conditions as Example 1 except that a release layer was changed as follows.

4. Formation of Release Layer

A release layer was formed through Mo—Ni—Fe plating under the following conditions.

Mo concentration: 20 g/L, Ni concentration: 6.5 g/L
Fe concentration: 3 g/L, sodium citrate: 150 g/L
pH 10.2 (30 ml/L of ammonia water added)
temperature: 30° C.
current density: 3 A/dm$^2$
plating time: 7 seconds A deposition amount of the release layer formed under the above conditions was 0.31 mg/dm$^2$, and a composition of the release layer included 23.42 wt % Mo, 69.81 wt % Ni, and 2.55 wt % Fe.

Comparative Example 2

Comparative Example 2 was obtained under the same conditions as Example 1 except that a release layer and an Al layer were changed as follows.

3. Formation of Release Layer

A release layer was formed to have a deposition amount of 0.89 mg/dm$^2$.

6. Formation of Al layer

An Al layer was formed to have a thickness of 0.05 μm and a surface roughness of 1.5 μm.

Hereinafter, peel strength of Examples 1 to 4 and Comparative Examples 1 and 2, a surface roughness of an Al layer, and a bonding property with a semiconductor chip through a wire will be described with reference to Table 1.

TABLE 1

| No | treatment condition | roughness (Rz, μm) | bonding property through wire bonding | peel strength (gf/cm) | circuit formation |
|---|---|---|---|---|---|
| 1 | Al layer thickness: 0.5 μm, Rz: 1.5 μm, deposition amount of release layer: 1.07 mg/dm² | 1.5 | ⊚ | 19 | ⊚ |
| 2 | Al layer thickness: 1.0 μm, Rz: 1.5 μm, deposition amount of release layer: 1.07 mg/dm² | 1.5 | ⊚ | 19 | ⊚ |
| 3 | Al layer thickness: 0.5 μm, Rz: 3.0 μm, deposition amount of release layer: 1.07 mg/dm² | 3.0 | ⊚ | 19 | ○ |
| 4 | Al layer thickness: 0.5 μm, Rz: 1.5 μm, deposition amount of release layer: 1.89 mg/dm² | 1.5 | ⊚ | 8 | ⊚ |
| Comparative Example 1 | Al layer thickness: 0.5 μm, Rz: 1.5 μm, deposition amount of release layer: 0.31 mg/dm² | 1.5 | ⊚ | X | ⊚ |
| Comparative Example 2 | Al layer thickness: 0.05 μm, Rz: 1.5 μm, deposition amount of release layer: 0.89 mg/dm² | 1.5 | ○ | 24 | X |

⊚: very excellent
○: excellent
X: defective

Evaluation of Peel Strength

In the case of Examples 1 to 3, peel strength with copper layers above and below the Al layer and peel strength of the Al layer and the carrier foil were very excellent. In the case of Example 4, peel strength of the ultra-thin copper foil and a carrier has a problem that peel strength between carriers was lowered due to a large deposition amount.

In the case of Comparative Example 1, peel strength of the Al layer and a carrier had a problem that the ultra-thin copper foil and the carrier were not peeled off due to a small deposition amount. In the case of Comparative Example 2, peel strength of the Al layer and a carrier was excellent.

Surface Roughness of Al Layer

In the case of Examples 1, 2, and 4, a surface roughness of the Al layer was low, and thus, an etching rate was excellent. As a result, a fine pattern was obtained when a circuit was formed. However, in the case of Example 3, a surface roughness of the Al layer was high, and thus, an etching rate was lower as compared with those of Examples 1 and 2. As a result, a desired fine pattern could not be obtained when a circuit was formed.

In the case of Comparative Example 1, when such treatment was performed, a surface roughness of the Al layer was low, and thus, an etching rate was excellent. As a result, a fine pattern was obtained when a circuit was formed. However, in the case of Comparative Example 2, an Al layer was thin, and thus, due to damage to a circuit etchant, a circuit having a desired shape could not be obtained.

Bonding Property with Semiconductor Chip Through Wire

In the case of Examples 1 to 4, when a semiconductor substrate was manufactured using the carrier foil-attached ultra-thin copper foil and was electrically connected to a semiconductor chip using a wire (gold, aluminum, or the like) having a diameter of 25 μm to 70 μm, a bonding property between the Al layer and the wire was also excellent.

In the case of Comparative Example 1, since the carrier foil-attached ultra-thin copper foil was not peeled off, a semiconductor substrate could not be manufactured. In the case of Comparative Example 2, when a semiconductor substrate was manufactured using the carrier foil-attached ultra-thin copper foil and was electrically connected to a semiconductor chip using a wire (gold, aluminum, or the like) having a diameter of 25 μm to 70 μm, due to damage caused by a thin Al layer during bonding, a bonding property between wires was lowered.

Second Embodiment

FIG. 7 is a schematic cross-sectional view illustrating a carrier foil-attached ultra-thin copper foil according to a second embodiment of the present invention. FIG. 8 shows a FIB image of a cross section of the carrier foil-attached ultra-thin copper foil according to the second embodiment of the present invention. FIG. 9 shows surface images of a matte surface and a shiny surface when an Al layer is not formed. FIG. 10 shows surfaces images of a matte surface and a shiny surface of the carrier foil-attached ultra-thin copper foil according to the second embodiment of the present invention.

In addition, FIG. 11 is a schematic cross-sectional view according to another example of a carrier foil-attached ultra-thin copper foil according to the second embodiment of the present invention.

Referring to FIGS. 7 to 10, a carrier foil-attached ultra-thin copper foil 20 according to the second embodiment of the present invention may include a carrier foil 21, a release layer 22, a first ultra-thin copper foil 23, a Cu—Al bonding strength improvement layer 24, a Cu diffusion prevention layer 25, an Al layer 26, and a second ultra-thin copper foil 27.

The Cu diffusion barrier layer 25 is illustrated in FIG. 7 as being formed on both an upper portion and a lower portion of the Al layer 26, but the Cu diffusion prevention layer 25 may be formed on only one of the upper portion and the lower portion of the Al layer 26.

The carrier foil-attached ultra-thin copper foil 20 may be formed by sequentially stacking the release layer 22, the first ultra-thin copper foil 23, the Cu—Al bonding strength improvement layer 24, the Cu diffusion prevention layer 25, the Al layer 26, and the second ultra-thin copper foil 27 on the carrier foil 21.

An aluminum foil, a stainless steel foil, a titanium foil, a copper foil, or a copper alloy foil may be used as the carrier foil 21. For example, an electrolytic copper foil, an electrolytic copper alloy foil, a rolled copper foil, or a rolled copper alloy foil may be used.

A surface of the carrier foil 21 may be a matte surface or a shiny surface of an untreated electrolytic copper foil or an untreated electrolytic copper alloy foil or a roll finished surface of a rolled copper foil or a rolled copper alloy foil. For example, the carrier foil may be a foil in which a matte surface or a shiny surface of an untreated electrolytic copper foil or an untreated electrolytic copper alloy foil is subjected to roughening treatment or a foil in which at least one surface of roll finished surfaces of a rolled copper foil or a rolled copper alloy foil is subjected to roughening treatment.

At least one of the first ultra-thin copper foil 23 and the second ultra-thin copper foil 27 may be formed through electroplating, electroless plating, or sputtering.

The first ultra-thin copper foil 23 may be formed through electroplating, and the second ultra-thin copper foil 27 may be formed through sputtering.

The release layer 22 may include a first metal A2 having a peeling property and second and third metals B2 and C2 which facilitate plating of the first metal A2.

The first metal A2 may be Mo or W, and the second metal B2 and the third metal C2 may be two different metals selected from the group consisting of Fe, Co, and Ni.

Here, at least one of the first metal A2, the second metal B2, and the third metal C2 may be an organic metal.

In the release layer 22, a content a2 of the first metal may A2 may range from about 30 wt % to about 89 wt %, a content b2 of the second metal B2 may range from about 10 wt % to about 60 wt %, and a content c2 of the third metal C2 may range from about 1 wt % to about 20 wt %.

Each of the contents a2, b2, and c2 of the metals is obtained by dividing a deposition amount (coating amount) of the first metal A2 per unit area of 1 $dm^2$ of the release layer by the sum of deposition amounts (coating amounts) of the first metal A2, the second metal B2, and the third metal C2 per the same area as the unit area and multiplying the obtained value by 100.

When the content a2 of the first metal and the content b2 of the second metal deviate from the content ranges, a peeling property of the ultra-thin copper foil may be lowered. When the content c2 of the third metal deviates from the content range, the release layer may be non-uniformly plated.

When the release layer includes only the first metal A2 and the second metal B2, a peeling property of the release layer may be non-uniform.

In addition, when the release layer is peeled off, the release layer may exhibit a tendency to be peeled off together with the ultra-thin copper foil.

On the other hand, in the present invention, when the release layer includes only the first metal A2 and the second metal B2 (for example, a Mo—Ni alloy layer), a peeling property of the release layer becomes unstable. Thus, in order to increase a plating amount of the first metal A2, i.e., a Mo metal that is a main factor of a peeling property of the release layer, Fe ions serving as a catalyst for plating the Mo metal are further added as the third metal C2. The addition of Fe ions enables the release layer to be uniformly plated.

In addition, the sum of deposition amounts of the release layer 22 may range from about 50 $\mu g/dm^2$ to about 10,000 $\mu g/dm^2$.

When the deposition amount is less than about 50 $\mu g/dm^2$, it may not be possible to serve as the release layer. When the deposition amount exceeds about 10,000 $\mu g/dm^2$, the release layer may become a metallic material rather than an oxidizing material that is a peelable material and thus may lose a peeling property.

On the other hand, a thickness t4 of the Al layer and a thickness t5 of a bonding pad of a semiconductor chip satisfy an expression of about $0.0005 \leq t4/t5 \leq$ about 3.0. A ratio t4/t5 of the thickness of the Al layer to the thickness of the bonding pad of the semiconductor chip may be implemented in a range of about 0.0005 to 3.0, thereby obtaining a more excellent effect.

In a specific example, the ratio t4/t5 of the thickness of the Al layer to the thickness of the bonding pad of the semiconductor chip may be about 0.0005, 0.001, 0.01, 0.1, 0.2, 0.3, 0.4, 0.5, 0.6, 0.7, 0.8, 0.9, 1.0, 1.5, 2.0, 2.5, or 3.0. In addition, the ratio t4/t5 of the thickness of the Al layer to the thickness of the bonding pad of the semiconductor chip may range approximately from one of the numerical values set forth above to another one of the numerical values set forth above.

Furthermore, the thickness t4 of the Al layer and a thickness t6 of a bonding wire of the semiconductor chip satisfy an expression of about $0.0005 \leq t4/t6 \leq$ about 3.0. A ratio t4/t6 of the thickness of the Al layer to the thickness of the bonding wire of the semiconductor chip may be implemented in a range of about 0.0005 to about 3.0, thereby obtaining a more excellent effect.

In a specific example, the ratio t4/t6 of the thickness of the Al layer to the thickness of the bonding wire of the semiconductor chip may be about 0.0005, 0.001, 0.01, 0.1, 0.2, 0.3, 0.4, 0.5, 0.6, 0.7, 0.8, 0.9, 1.0, 1.5, 2.0, 2.5, or 3.0. In addition, the ratio t4/t6 of the thickness of the Al layer to the thickness of the bonding wire of the semiconductor chip may range approximately from one of the numerical values set forth above to another one of the numerical values set forth above.

The matte surface or the shiny surface of the carrier foil may have a surface roughness of about 3 μm or less. The Al layer is formed through electroplating or sputtering and has a surface roughness of about 3 μm or less.

Furthermore, a surface roughness r3 of the matte surface or the shiny surface of the carrier foil and a surface roughness r4 of the Al layer satisfy an expression of $r4/r3 \leq 3.0$. A ratio r2/r1 of the surface roughness of the Al layer to the surface roughness of the matte surface or the shiny surface of the carrier foil may be implemented in a range of 3.0 or less, thereby obtaining a more excellent effect.

The ratio r2/r1 of the surface roughness of the Al layer to the surface roughness of the matte surface or the shiny surface of the carrier foil may be about 0, 0.1, 0.2, 0.3, 0.4, 0.5, 0.6, 0.7, 0.8, 0.9, 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, or 3.0. In addition, the ratio r2/r1 of the surface roughness of the Al layer to the surface roughness of the matte surface or the shiny surface of the carrier foil may range approximately from one of the numerical values set forth above to another one of the numerical values set forth above.

The Cu diffusion prevention layer 25 may be formed between the Al layer 26 and the first ultra-thin copper foil 23 and between the Al layer 26 and the second ultra-thin copper foil 27. The Cu diffusion prevention layer 25 is for preventing aluminum of the Al layer 26 and copper of the first ultra-thin copper foil 23 or the second ultra-thin copper foil 27 from forming a Cu—Al-based intermetallic compound.

Specifically, when the Al layer and the first ultra-thin copper foil or the second ultra-thin copper foil strongly combine with each other and are mixed in an alloy, an intermediate phase constituting a non-uniform structure is formed. The intermediate phase does not have a property of each metal, is susceptible to impact, and has a property in which electrical resistance is increased.

That is, the Cu diffusion prevention layer 25 prevents the aluminum of the Al layer 26 and the copper of the first ultra-thin copper foil 23 or the second ultra-thin copper foil 27 from forming an intermetallic compound.

In addition, a thickness t7 of the Cu diffusion prevention layer and the thickness t4 of the Al layer satisfy an expression of about 0.5≤t7/t4≤about 1.0. In addition, a ratio t7/t4 of the thickness of the Cu diffusion prevention layer to the thickness of the Al layer may be implemented in a range of about 0.5 to 1.0, thereby obtaining a more excellent effect.

Specifically, the ratio t7/t4 of the thickness of the Cu diffusion prevention layer to the thickness of the Al layer may be about 0.5, 0.6, 0.7, 0.8, 0.9, or 1.0. In addition, the ratio t7/t4 of the thickness of the Cu diffusion prevention layer to the thickness of the Al layer may range approximately from one of the numerical values set forth above to another one of the numerical values set forth above.

Bonding strength p1 between the first ultra-thin copper foil and the Al layer or between the second ultra-thin copper foil and the Al layer and bonding strength p2 of the release layer satisfy an expression of about 1≤p1/p2≤about 30.0. A ratio p1/p2 of the bonding strength between the first ultra-thin copper foil and the Al layer or between the second ultra-thin copper foil and the Al layer to the bonding strength of the release layer may be implemented in a range of about 1 to about 30.0, thereby obtaining a more excellent effect.

In a specific example, the ratio p1/p2 of the bonding strength between the first ultra-thin copper foil and the Al layer or between the second ultra-thin copper foil and the Al layer to the bonding strength of the release layer may be about 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30. In addition, the ratio p1/p2 of the bonding strength between the first ultra-thin copper foil and the Al layer or between the second ultra-thin copper foil and the Al layer and the bonding strength of the release layer may range approximately from one of the numerical values set forth above to another one of the numerical values set forth above.

The Cu—Al bonding strength improvement layer 24 may be formed between the Al layer 26 and the Cu diffusion prevention layer 25 and may be made of an intermediate material between copper and aluminum so as to improve bonding strength between the Al layer 26 and the Cu diffusion prevention layer 25.

Referring to FIG. 11, a carrier foil-attached ultra-thin copper foil 30 according to an embodiment of the present invention may further include a diffusion prevention layer 38 and an oxidation prevention layer 39.

The carrier foil-attached ultra-thin copper foil 30 may be formed by sequentially stacking a diffusion prevention layer 38, a release layer 32, the oxidation prevention layer 39, a first ultra-thin copper foil 33, bonding strength improvement layer 34, a Cu diffusion prevention layer 35, an Al layer 36, and a second ultra-thin copper foil 37 on a carrier foil 31.

The diffusion prevention layer 38 and the oxidation prevention layer 39 are formed using the same plating condition and thus have substantially the same composition. However, since a metal deposition amount of the diffusion prevention layer 38 is increased as compared with the oxidation prevention layer 39, the diffusion prevention layer 38 is thicker than the oxidation prevention layer 39.

Due to the presence of the diffusion prevention layer 38 in the carrier foil-attached ultra-thin copper foil 30, peel strength of the carrier foil and the ultra-thin copper foil is maintained at a constant low value even in a high temperature processing environment, and thus, the carrier foil and the ultra-thin copper foil are easily peeled off.

In addition, the oxidation prevention layer 39 may be thinner than the diffusion prevention layer 38 in the carrier foil-attached ultra-thin copper foil 30, and thus, stable peel strength, high corrosion resistance of the oxidation prevention layer 39, and improved laser processability may be implemented at the same time.

Furthermore, the diffusion prevention layer 38 and the oxidation prevention layer 39 may use substantially the same plating solution in the carrier foil-attached ultra-thin copper foil 30, thereby simplifying a manufacturing process.

The diffusion prevention layer 38 and the oxidation prevention layer 39 may include at least one element selected from the group consisting of Ni, Co, Fe, Cr, Mo, W, Al, and P. For example, the diffusion prevention layer and the oxidation prevention layer may each be a single metal layer, an alloy layer made of two or more metals, or a metal oxide layer made of one or more metals.

For example, plating for forming a single metal layer may include nickel plating, cobalt plating, iron plating, aluminum plating, and the like. Plating for forming a binary alloy layer may include nickel-cobalt plating, nickel-iron plating, nickel-chromium plating, nickel-molybdenum plating, nickel-tungsten plating, nickel-copper plating, nickel-phosphorous plating, cobalt-iron plating, cobalt-chromium plating, cobalt-molybdenum plating, cobalt-tungsten plating, cobalt-copper plating, and cobalt-phosphorous plating. Plating for forming a ternary alloy layer may include nickel-cobalt-iron plating, nickel-cobalt-chromium plating, nickel-cobalt-molybdenum plating, nickel-cobalt-tungsten plating, nickel-cobalt-copper plating, nickel-cobalt-phosphorous plating, nickel-iron-chromium plating, nickel-iron-molybdenum plating, nickel-iron-tungsten plating, nickel-iron-copper plating, nickel-iron-phosphorous plating, nickel-chromium-molybdenum plating, nickel-chromium-tungsten plating, nickel-chromium-copper plating, nickel-chromium-phosphorus plating, nickel-molybdenum-tungsten plating, nickel-molybdenum-copper plating, nickel-molybdenum-phosphorous plating, nickel-tungsten-copper plating, nickel-tungsten-phosphorous plating, nickel-copper-phosphorous plating, cobalt-iron-chromium plating, cobalt-iron-molybdenum plating, cobalt-iron-tungsten plating, cobalt-iron-copper plating, cobalt-iron-phosphorous plating, cobalt-chromium-molybdenum plating, cobalt-chromium-tungsten plating, cobalt-chromium-copper plating, cobalt-chromium-phosphorous plating, cobalt-molybdenum-phosphorous plating, cobalt-tungsten-copper plating, cobalt-molybdenum-phosphorous plating, cobalt-tungsten-copper plating, cobalt-tungsten-phosphorous plating, and cobalt-copper-phosphorous plating.

For example, the diffusion prevention layer and the oxidation prevention layer may include Ni and P.

In addition, an oxide may include nickel oxide, cobalt oxide, iron oxide, chromium oxide, molybdenum oxide, tungsten oxide, copper oxide, aluminum oxide, phosphorus oxide, and the like. Furthermore, a mixture of two or more of the above oxides and the like may be used.

In addition, a layer selected from a plating layer made of a single metal, an alloy plating layer, and an oxide layer may be formed as two or more layers.

The diffusion prevention layer may serve to prevent copper from being diffused into the release layer when the carrier foil-attached ultra-thin copper foil is pressed at a high temperature together with an insulating substrate. When the carrier foil-attached ultra-thin copper foil is pressed at a high temperature together with the insulating substrate without forming the diffusion preventing layer, copper may be diffused from the carrier foil and the ultra-thin copper foil to the release layer to form metallic binding between the carrier foil and the ultra-thin copper foil. It may be difficult to peel the carrier foil due to a strong binding force between the carrier foil and the ultra-thin copper foil.

Hereinafter, the present invention will be described in detail with reference to exemplary embodiments but is not limited thereto.

(Manufacture of Carrier Foil-Attached Ultra-Thin Copper Foil)

Example 1

1. Formation of Carrier Foil

A carrier foil had a surface roughness of 1.5 µm, and an electrolytic copper foil having a thickness of 18 µm was used.

2. Formation of Diffusion Prevention Layer

A diffusion prevention layer was formed through Ni—P plating under the following conditions.

Ni concentration: 15 g/L, P concentration: 8 g/L
pH 4.0
temperature: 30° C.
current density: 1.5 A/dm$^2$
plating time: 2 seconds A deposition amount of the diffusion prevention layer formed under the above conditions was a metal (Ni) deposition amount of 301 µg/dm$^2$.

3. Formation of Release Layer

A release layer was formed through Mo—Ni—Fe plating under the following conditions.

Mo concentration: 20 g/L, Ni concentration: 6.5 g/L
Fe concentration: 3 g/L, sodium citrate: 150 g/L
pH 10.2 (30 ml/L of ammonia water added)
temperature: 30° C.
current density: 10 A/dm$^2$
plating time: 7 seconds A deposition amount of the release layer formed under the above conditions was 1.07 mg/dm$^2$, and a composition of the release layer included 60.55 wt % Mo, 29.8 wt % Ni, and 5.99 wt % Fe.

4. Formation of Oxidation Prevention Layer

An oxidation prevention layer was formed through Ni—P plating under the following conditions.

Ni concentration: 15 g/L, P concentration: 8 g/L
pH 4.0
temperature: 30° C.
current density: 0.5 A/dm$^2$
plating time: 2 seconds A deposition amount of the oxidation prevention layer formed under the above conditions was a metal (Ni) deposition amount of 30 µg/dm$^2$.

5. Formation of First Ultra-Thin Copper Foil

A first ultra-thin copper foil was formed under the following conditions.

$CuSO_4$-$5H_2O$: 300 g/L, $H_2SO_4$: 150 g/L
temperature: 30° C.
current density: 20 A/dm$^2$
plating time: 25 seconds A thickness of the first ultra-thin copper foil formed under the above conditions was 2 µm.

6. Formation of Cu—Al Bonding Strength Improvement Layer

A Cu—Al bonding strength improvement layer, which is a layer improving bonding strength between the first ultra-thin copper foil and an Al layer, was formed, and a thickness of Cu was 0.03 µm.

7. Formation of Cu Diffusion Prevention Layer

An $Al_2O_3$ layer was formed to have a thickness of 0.005 µm above and below an Al layer so as to prevent the formation of an alloy after a copper layer and the Al layer are heat-treated.

8. Formation of Al Layer

A thickness of an Al layer, that is, a wire bonding layer, was 0.5 µm, and a surface roughness thereof was 1.5 µm, which is the same as the roughness of the carrier foil.

9. Formation of Second Ultra-Thin Copper Foil

A second ultra-thin copper foil was formed under the following conditions.

$CuSO_4$-$5H_2O$: 300 g/L, $H_2SO_4$: 150 g/L
temperature: 30° C.
current density: 20 A/dm$^2$
plating time: 5 seconds A thickness of the second ultra-thin copper foil formed under the above conditions was 0.5 µm.

Example 2

Example 2 was obtained under the same conditions as Example 1 except that an Al layer was changed as follows.

8. Formation of Al Layer

A thickness of an Al layer, that is, a wire bonding layer, was 1.0 µm, and a surface roughness thereof was 1.5 µm, which is the same as a roughness of a carrier foil.

Example 3

Example 3 was obtained under the same conditions as Example 1 except that a carrier foil and an Al layer were changed as follows.

1. Formation of Carrier Foil

A carrier foil had a surface roughness of 3.0 µm, and an electrolytic copper foil having a thickness of 18 µm was used.

8. Formation of Al Layer

A thickness of an Al layer, that is, a wire bonding layer, was 0.5 µm, and a surface roughness thereof was 3.0 µm, which is the same as the roughness of the carrier foil.

Example 4

Example 4 was obtained under the same conditions as Example 1 except that a release layer, a Cu—Al bonding strength improvement layer, and Cu diffusion prevention layer were changed as follows.

3. Formation of Release Layer

A release layer was formed through Mo—Ni—Fe plating under the following conditions.

Mo concentration: 20 g/L, Ni concentration: 6.5 g/L
Fe concentration: 3 g/L, sodium citrate: 150 g/L
pH 10.2 (30 ml/L of ammonia water added)
temperature: 30° C.

current density: 18 A/dm$^2$
plating time: 7 seconds

A deposition amount of the release layer formed under the above conditions was 1.89 mg/dm$^2$, and a composition of the release layer included 51.99 wt % Mo, 38.8 wt % Ni, and 5.55 wt % Fe.

6. Formation of Cu—Al Bonding Strength Improvement Layer

A Cu—Al bonding strength improvement layer, which is a layer improving bonding strength between the first ultra-thin copper foil and the Al layer, was formed, and a thickness of Cu was 0.01 μm.

7. Formation of Cu Diffusion Prevention Layer

An Al$_2$O$_3$ layer was formed to have a thickness of 0.015 μm above and below an Al layer so as to prevent the formation of an alloy after a copper layer and the Al layer are heat-treated.

Comparative Example 1

Comparative Example 1 was obtained under the same conditions as Example 1 except that a release layer was changed as follows.

3. Formation of Release Layer

A release layer was formed through Mo—Ni—Fe plating under the following conditions.

Mo concentration: 20 g/L Ni concentration: 6.5 g/L
Fe concentration: 3 g/L, sodium citrate: 150 g/L
pH 10.2 (30 ml/L of ammonia water added)
temperature: 30° C.
current density: 3 A/dm$^2$
plating time: 7 seconds A deposition amount of the release layer formed under the above conditions was 0.31 mg/dm$^2$, and a composition of the release layer included 23.42 wt % Mo, 69.81 wt % Ni, and 2.55 wt % Fe.

Comparative Example 2

Comparative Example 2 was obtained under the same conditions as Example 1 except that a release layer, a Cu—Al bonding strength improvement layer, and an Al layer were changed as follows.

3. Formation of Release Layer

A release layer was formed to have a deposition amount of 0.89 mg/dm$^2$.

6. Formation of Cu—Al Bonding Strength Improvement Layer

A Cu—Al bonding strength improvement layer was formed to have a bonding strength of about 8 gf/cm.

8. Formation of Al Layer

An Al layer was formed to have a thickness of 0.4 μm and a surface roughness of 1.5 μm.

Hereinafter, peel strength of Examples 1 to 4 and Comparative Examples 1 and 2, a surface roughness of an Al layer, and a bonding property with a semiconductor chip through a wire will be described with reference to Table 2.

TABLE 2

| No | treatment condition | roughness (Rz, μm) | bonding property through wire bonding | thickness (μm) of Cu diffusion prevention layer | thickness (μm) of Cu—Al bonding strength improvement layer | Cu—Al bonding strength (gf/cm) | peel strength (gf/cm) | circuit formation |
|---|---|---|---|---|---|---|---|---|
| 1 | Al layer thickness: 0.5 μm, Rz: 1.5 μm, deposition amount of release layer: 1.07 mg/dm$^2$ | 1.5 | ◎ | 0.005 | 0.03 | 214 | 19 | ◎ |
| 2 | Al layer thickness: 1.0 μm, Rz: 1.5 μm, deposition amount of release layer: 1.07 mg/dm$^2$ | 1.5 | ◎ | 0.005 | 0.03 | 178 | 19 | ◎ |
| 3 | Al layer thickness: 0.5 μm, Rz: 3.0 μm, deposition amount of release layer: 1.07 mg/dm$^2$ | 3.0 | ◎ | 0.005 | 0.03 | 194 | 19 | ○ |
| 4 | Al layer thickness: 0.5 μm, Rz: 1.5 μm, deposition amount of release layer: 1.89 mg/dm$^2$ | 1.5 | ◎ | 0.015 | 0.1 | 214 | 8 | ◎ |
| Comparative Example 1 | Al layer thickness: 0.5 μm, Rz: 1.5 μm, deposition amount of release layer: 0.31 mg/dm$^2$ | 1.5 | ◎ | 0.003 | 0.05 | 169 | X | ◎ |
| Comparative Example 2 | Al layer thickness: 0.05 μm, Rz: 1.5 μm, deposition amount of release layer: 0.89 mg/dm$^2$ | 1.5 | ○ | 0.001 | 0.01 | 8 | 24 | X |

◎: very excellent
○: excellent
X: defective

Peel Strength and Bonding Property of Al Layer

In the case of Example 1, peel strength with copper layers above and below the Al layer was very excellent. In particular, after Example 1 was formed into a copper clad laminate (CCL), bonding strength between the Al layer and the ultra-thin copper foil layer was excellent. In the case of Examples 2 and 3, peel strength of the Al layer and a carrier was very excellent. In the case of Example 4, peel strength between the ultra-thin copper foil and a carrier was lowered due to a large deposition amount.

In the case of Comparative Example 1, peel strength of the Al layer and a carrier had a problem that the ultra-thin copper foil and the carrier were not peeled off due to a small deposition amount. The release layer was excellent, but bonding strength between the Al layer and the ultra-thin copper foil was weak, resulting in occurrence of a lifting phenomenon of the Al layer.

Surface Roughness of Al Layer

In the case of Examples 1, 2, and 4, a surface roughness of the Al layer was low, and thus, an etching rate was excellent. As a result, a fine pattern was obtained when a circuit was formed. In the case of Example 3, a surface roughness of the Al layer was high, and thus, an etching rate was lower as compared with Examples 1 and 2. As a result, a desired fine pattern could not be obtained when a circuit was formed.

In the case of Comparative Example 1, when such treatment was performed, a surface roughness of the Al layer was low, and thus, an etching rate was excellent. As a result, a fine pattern was obtained when a circuit was formed. However, in the case of Comparative Example 2, since the bonding strength between the Al layer and the ultra-thin copper foil was weak, due to a lifting phenomenon of the Al layer, a circuit etchant was damaged, and thus, a circuit having a desired shape could not be obtained.

Bonding Property with Semiconductor Chip Through Wire

In the case of Examples 1 to 4, when a semiconductor substrate was manufactured using the carrier foil-attached ultra-thin copper foil and was electrically connected to a semiconductor chip using a wire (gold, aluminum, or the like) having a diameter in a range of 25 µm to 70 µm, a bonding property between the Al layer and the wire was also excellent.

In the case of Comparative Example 1, since the carrier foil-attached ultra-thin copper foil was not peeled off, a semiconductor substrate could not be manufactured. In the case of Comparative Example 2, since the Al layer and an ultra-thin copper foil phase were peeled off, a semiconductor substrate could not be manufactured.

Third Embodiment

FIG. 12 is a schematic cross-sectional view illustrating a carrier foil-attached ultra-thin copper foil according to a third embodiment of the present invention. FIG. 13 shows a FIB image of a cross section of the carrier foil-attached ultra-thin copper foil according to the third embodiment of the present invention. FIG. 14 shows surface images of a matte surface and a shiny surface when an Al layer is not formed. FIG. 15 shows surfaces images of a matte surface and a shiny surface of the carrier foil-attached ultra-thin copper foil according to the third embodiment of the present invention.

In addition, FIG. 16 is a schematic cross-sectional view according to another example of the carrier foil-attached ultra-thin copper foil according to the third embodiment of the present invention.

Referring to FIGS. 13 to 15, a carrier foil-attached ultra-thin copper foil 40 according to the third embodiment of the present invention may include a carrier foil 41, a release layer 42, a first ultra-thin copper foil 43, a Cu—Al bonding strength improvement layer 44, an Al layer 45, and a second ultra-thin copper foil 46.

The carrier foil-attached ultra-thin copper foil 40 may be formed by sequentially stacking the release layer 42, the first ultra-thin copper foil 43, the Cu—Al bonding strength improvement layer 44, the Al layer 45, and the second ultra-thin copper foil 46 on the carrier foil 41.

An aluminum foil, a stainless steel foil, a titanium foil, a copper foil, or a copper alloy foil may be used as the carrier foil 41. For example, an electrolytic copper foil, an electrolytic copper alloy foil, a rolled copper foil, or a rolled copper alloy foil may be used.

A surface of the carrier foil 41 may be a matte surface or a shiny surface of an untreated electrolytic copper foil or an untreated electrolytic copper alloy foil or a roll finished surface of a rolled copper foil or a rolled copper alloy foil. For example, the carrier foil may be a foil in which a matte surface or a shiny surface of an untreated electrolytic copper foil or an untreated electrolytic copper alloy foil is subjected to roughening treatment or a foil in which at least one surface of roll finished surfaces of a rolled copper foil or a rolled copper alloy foil is subjected to roughening treatment.

At least one of the first ultra-thin copper foil 43 and the second ultra-thin copper foil 46 may be formed through electroplating, electroless plating, or sputtering.

The first ultra-thin copper foil 43 may be formed through electroplating, and the second ultra-thin copper foil 46 may be formed through sputtering.

The release layer 42 may include a first metal A3 having a peeling property, and a second metal B3 and a third metal C3 which facilitate plating of the first metal A3.

The first metal A3 may be Mo or W, and the second metal B3 and the third metal C3 may be two different metals selected from the group consisting of Fe, Co, and Ni.

Here, at least one of the first metal A3, the second metal B3, and the third metal C3 may be an organic metal.

In the release layer 42, a content a3 of the first metal A3 may range from about 30 wt % to about 89 wt %, a content b3 of the second metal B3 may range from about 10 wt % to about 60 wt %, and a content c3 of the third metal C3 may range from about 1 wt % to about 20 wt %.

Each of the contents a3, b3, and c3 of the metals is obtained by dividing a deposition amount (coating amount) of the first metal A3 per unit area of 1 dm$^2$ of the release layer by the sum of deposition amounts (coating amounts) of the first metal A3, the second metal B3, and the third metal C3 per the same area as the unit and multiplying the obtained value by 100.

When the content a3 of the first metal and the content b3 of the second metal deviate from the content ranges, a peeling property of the ultra-thin copper foil may be lowered. When the content c3 of the third metal deviates from the content range, the release layer may be non-uniformly plated.

When the release layer includes only the first metal A3 and the second metal B3, a peeling property of the release layer may be non-uniform.

In addition, when the release layer is peeled off, the release layer may exhibit a tendency to be peeled off together with the ultra-thin copper foil.

On the other hand, in the present invention, when the release layer includes only the first metal A3 and the second metal B3 (for example, a Mo—Ni alloy layer), a peeling property of the release layer becomes unstable. Thus, in order to increase a plating amount of the first metal A3, i.e., a Mo metal that is a main factor of a peeling property of the release layer, Fe ions serving as a catalyst for plating the Mo metal are further added as the third metal C3. The addition of Fe ions enables the release layer to be uniformly plated.

In addition, the sum of deposition amounts of the release layer 42 may range from about 50 $\mu g/dm^2$ to about 10,000 $\mu g/dm^2$.

When the deposition amount is less than about 50 $\mu g/dm^2$, it may not be possible to serve as the release layer. When the deposition amount exceeds about 10,000 $\mu g/dm^2$, the release layer may become a metallic material rather than an oxidizing material that is a peelable material and thus may lose a peeling property.

On the other hand, a thickness t8 of the Al layer and a thickness t9 of a bonding pad of a semiconductor chip satisfy an expression of about $0.0005 \leq t8/t9 \leq $ about 3.0.

A ratio t8/t9 of the thickness of the Al layer to the thickness of the bonding pad of the semiconductor chip may be implemented in a range of about 0.0005 to about 3.0, thereby obtaining a more excellent effect.

In a specific example, the ratio t8/t9 of the thickness of the Al layer to the thickness of the bonding pad of the semiconductor chip may be about 0.0005, 0.001, 0.01, 0.1, 0.2, 0.3, 0.4, 0.5, 0.6, 0.7, 0.8, 0.9, 1.0, 1.5, 2.0, 2.5, or 3.0. The ratio t8/t9 of the thickness of the Al layer to the thickness of the bonding pad of the semiconductor chip may range approximately from one of the numerical values set forth above to another one of the numerical values set forth above.

In addition, the thickness t8 of the Al layer and a thickness t10 of a bonding wire of the semiconductor chip satisfy an expression of about $0.0005 \leq t8/t10 \leq $ about 3.0. A ratio t8/t10 of the thickness of the Al layer to the thickness of the bonding wire of the semiconductor chip may be implemented in a range of about 0.0005 to about 3.0, thereby obtaining a more excellent effect.

In a specific example, the ratio t8/t10 of the thickness of the Al layer to the thickness of the bonding wire of the semiconductor chip may be about 0.0005, 0.001, 0.01, 0.1, 0.2, 0.3, 0.4, 0.5, 0.6, 0.7, 0.8, 0.9, 1.0, 1.5, 2.0, 2.5, or 3.0. In addition, the ratio t8/t10 of the thickness of the Al layer to the thickness of the bonding wire of the semiconductor chip may range approximately from one of the numerical values set forth above to another one of the numerical values set forth above.

The matte surface or the shiny surface of the carrier foil may have a surface roughness of 3 μm or less. The Al layer is formed through electroplating or sputtering and has a surface roughness of 3 μm or less.

In addition, a surface roughness r5 of the matte surface or the shiny surface of the carrier foil and a surface roughness r6 of the Al layer satisfy an expression of $r6/r5 \leq$ about 3.0. A ratio r6/r5 of the surface roughness of the Al layer to the surface roughness of the matte surface or the shiny surface of the carrier foil may be implemented in a range of about 3.0 or less, thereby obtaining a more excellent effect.

In a specific example, the ratio r6/r5 of the surface roughness of the Al layer to the surface roughness of the matte surface or the shiny surface of the carrier foil may be about 0, 0.1, 0.2, 0.3, 0.4, 0.5, 0.6, 0.7, 0.8, 0.9, 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, or 3.0 The ratio r6/r5 of the surface roughness of the Al layer to the surface roughness of the matte surface or the shiny surface of the carrier foil may range approximately from one of the numerical values set forth above to another one of the numerical values set forth above.

The Cu—Al bonding strength improvement layer 44 may be formed between the Al layer 46 and the first ultra-thin copper foil 43 and between the Al layer 45 and the second ultra-thin copper foil 46 and may be made of an intermediate material between copper and aluminum so as to improve bonding strength between aluminum of the Al layer 44 and copper of the first ultra-thin copper foil 43 or the second ultra-thin copper foil 46.

Bonding strength p3 between the first ultra-thin copper foil and the Al layer or between the second ultra-thin copper foil and the Al layer and bonding strength p4 of the release layer satisfy an expression of about $1 \leq p3/p4 \leq$ about 30.0. A ratio p3/p4 of the bonding strength between the first ultra-thin copper foil and the Al layer or between the second ultra-thin copper foil and the Al layer and the bonding strength of the release layer may be implemented in a range of about 1 to about 30.0, thereby obtaining a more excellent effect.

In a specific example, the ratio p3/p4 of the bonding strength between the first ultra-thin copper foil and the Al layer or between the second ultra-thin copper foil and the Al layer to the bonding strength of the release layer may be about 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30. In addition, the ratio p3/p4 of the bonding strength between the first ultra-thin copper foil and the Al layer or between the second ultra-thin copper foil and the Al layer and the bonding strength of the release layer may range approximately from one of the numerical values set forth above to another one of the numerical values set forth above.

Referring to FIG. 16, a carrier foil-attached ultra-thin copper foil 50 according to an embodiment of the present invention may further include a diffusion prevention layer 57 and an oxidation prevention layer 58.

Specifically, the carrier foil-attached ultra-thin copper foil 50 may be formed by sequentially stacking the diffusion prevention layer 57, a release layer 52, the oxidation prevention layer 58, a first ultra-thin copper foil 53, a Cu—Al bonding strength improvement layer 54, an Al layer 55, and a second ultra-thin copper foil 56 on a carrier foil 51.

The diffusion prevention layer 57 and the oxidation prevention layer 58 are formed using the same plating condition and thus have substantially the same composition. However, since a metal deposition amount of the diffusion prevention layer 57 is increased as compared with the oxidation prevention layer 58, the diffusion prevention layer 57 is thicker than the oxidation prevention layer 58.

Due to the presence of the diffusion prevention layer 57 in the carrier foil-attached ultra-thin copper foil 50, peel strength of the carrier foil and the ultra-thin copper foil is maintained at a constant low value even in a high temperature processing environment, and thus, the carrier foil and the ultra-thin copper foil are easily peeled off.

In addition, the oxidation prevention layer may be thinner than the diffusion prevention layer in the carrier foil-attached ultra-thin copper foil, and thus, stable peel strength, high corrosion resistance of the oxidation prevention layer, and improved laser processability may be implemented at the same time.

Furthermore, the diffusion prevention layer 57 and the oxidation prevention layer 58 may use substantially the same plating solution in the carrier foil-attached ultra-thin copper foil 50, thereby simplifying a manufacturing process.

The diffusion prevention layer 57 and the oxidation prevention layer 58 may include at least one element selected from the group consisting of Ni, Co, Fe, Cr, Mo, W, Al, and P. For example, the diffusion prevention layer and the oxidation prevention layer may each be a single metal layer, an alloy layer made of two or more metals, or a metal oxide layer made of one or more metals.

For example, nickel plating, cobalt plating, iron plating, aluminum plating, or the like may be used as plating for forming a single metal layer. Plating for forming a binary alloy layer may include nickel-cobalt plating, nickel-iron plating, nickel-chromium plating, nickel-molybdenum plating, nickel-tungsten plating, nickel-copper plating, nickel-phosphorous plating, cobalt-iron plating, cobalt-chromium plating, cobalt-molybdenum plating, cobalt-tungsten plating, cobalt-copper plating, and cobalt-phosphorous plating. Plating for forming a ternary alloy layer may include nickel-cobalt-iron plating, nickel-cobalt-chromium plating, nickel-cobalt-molybdenum plating, nickel-cobalt-tungsten plating, nickel-cobalt-copper plating, nickel-cobalt-phosphorous plating, nickel-iron-chromium plating, nickel-iron-molybdenum plating, nickel-iron-tungsten plating, nickel-iron-copper plating, nickel-iron-phosphorous plating, nickel-chromium-molybdenum plating, nickel-chromium-tungsten plating, nickel-chromium-copper plating, nickel-chromium-phosphorus plating, nickel-molybdenum-tungsten plating, nickel-molybdenum-copper plating, nickel-molybdenum-phosphorous plating, nickel-tungsten-copper plating, nickel-tungsten-phosphorous plating, nickel-copper-phosphorous plating, cobalt-iron-chromium plating, cobalt-iron-molybdenum plating, cobalt-iron-tungsten plating, cobalt-iron-copper plating, cobalt-iron-phosphorous plating, cobalt-chromium-molybdenum plating, cobalt-chromium-tungsten plating, cobalt-chromium-copper plating, cobalt-chromium-phosphorous plating, cobalt-molybdenum-phosphorous plating, cobalt-tungsten-copper plating, cobalt-molybdenum-phosphorous plating, cobalt-tungsten-copper plating, cobalt-tungsten-phosphorous plating, and cobalt-copper-phosphorous plating.

For example, the diffusion prevention layer and the oxidation prevention layer may include Ni and P.

In addition, an oxide may include nickel oxide, cobalt oxide, iron oxide, chromium oxide, molybdenum oxide, tungsten oxide, copper oxide, aluminum oxide, phosphorus oxide, and the like. Furthermore, a mixture of two or more of the above oxides and the like may be used.

In addition, a layer selected from a plating layer made of a single metal, an alloy plating layer, and an oxide layer may be formed as two or more layers.

The diffusion prevention layer may serve to prevent copper from being diffused into the release layer when the carrier foil-attached ultra-thin copper foil is pressed together with an insulating substrate at a high temperature. When the carrier foil-attached ultra-thin copper foil is pressed at a high temperature together with the insulating substrate without forming the diffusion preventing layer, copper may be diffused from the carrier foil and the ultra-thin copper foil to the release layer to form metallic binding between the carrier foil and the ultra-thin copper foil. It may be difficult to peel the carrier foil due to a strong binding force between the carrier foil and the ultra-thin copper foil.

Hereinafter, the present invention will be described in detail with reference to exemplary embodiments but is not limited thereto.

(Manufacture of Carrier Foil-Attached Ultra-Thin Copper Foil)

Example 1

1. Formation of Carrier Foil

A carrier foil had a surface roughness of 1.5 µm, and an electrolytic copper foil having a thickness of 18 µm was used.

2. Formation of Diffusion Prevention Layer

A diffusion prevention layer was formed through Ni—P plating under the following conditions.

Ni concentration: 15 g/L, P concentration: 8 g/L
pH 4.0
temperature: 30° C.
current density: 1.5 A/dm$^2$
plating time: 2 seconds A deposition amount of the diffusion prevention layer formed under the above conditions was a metal (Ni) deposition amount of 301 µg/dm$^2$.

3. Formation of Release Layer

A release layer was formed through Mo—Ni—Fe plating under the following conditions.

Mo concentration: 20 g/L, Ni concentration: 6.5 g/L
Fe concentration: 3 g/L, sodium citrate: 150 g/L
pH 10.2 (30 ml/L of ammonia water added)
temperature: 30° C.
current density: 10 A/dm$^2$
plating time: 7 seconds A deposition amount of the release layer formed under the above conditions was 1.07 mg/dm$^2$, and a composition of the release layer included 60.55 wt % Mo, 29.8 wt % Ni, and 5.99 wt % Fe.

4. Formation of Oxidation Prevention Layer

An oxidation prevention layer was formed through Ni—P plating under the following conditions.

Ni concentration: 15 g/L, P concentration: 8 g/L
pH 4.0
temperature: 30° C.
current density: 0.5 A/dm$^2$
plating time: 2 seconds A deposition amount of the oxidation prevention layer formed under the above conditions was a metal (Ni) deposition amount of 30 µg/dm$^2$.

5. Formation of First Ultra-Thin Copper Foil

A first ultra-thin copper foil was formed under the following conditions.

$CuSO_4$-$5H_2O$: 300 g/L, $H_2SO_4$: 150 g/L
temperature: 30° C.
current density: 20 A/dm$^2$
plating time: 25 seconds A thickness of the first ultra-thin copper foil formed under the above conditions was 2 µm.

6. Formation of Cu—Al Bonding Strength Improvement Layer

A Cu—Al bonding strength improvement layer, which is a layer improving bonding strength between the first ultra-thin copper foil and the Al layer, was formed, and a thickness of Cu was 0.03 µm.

7. Formation of Al Layer

A thickness of an Al layer, that is, a wire bonding layer, was 0.5 µm, and a surface roughness thereof was 1.5 µm, which is the same as the roughness of the carrier foil.

8. Formation of Second Ultra-Thin Copper Foil

A second ultra-thin copper foil was formed under the following conditions.

$CuSO_4$-$5H_2O$: 300 g/L, $H_2SO_4$: 150 g/L temperature: 30° C.
current density: 20 A/dm$^2$
plating time: 5 seconds
A thickness of the second ultra-thin copper foil formed under the above conditions was 0.5 μm.

Example 2

Example 2 was obtained under the same conditions as Example 1 except that an Al layer was changed as follows.
7. Formation of Al Layer
A thickness of an Al layer, that is, a wire bonding layer, was 1.0 μm, and a surface roughness thereof was 1.5 μm, which is the same as a roughness of a carrier foil.

Example 3

Example 3 was obtained under the same conditions as Example 1 except that a carrier foil and an Al layer were changed as follows.
1. Formation of Carrier Foil
A carrier foil had a surface roughness of 3.0 μm, and an electrolytic copper foil having a thickness of 18 μm was used.
7. Formation of Al Layer
A thickness of an Al layer, that is, a wire bonding layer, was 0.5 μm, and a surface roughness thereof was 3.0 μm, which is the same as the roughness of the carrier foil.

Example 4

Example 4 was obtained under the same conditions as Example 1 except that a release layer and a Cu—Al bonding strength improvement layer were changed as follows.
3. Formation of Release Layer
A release layer was formed through Mo—Ni—Fe plating under the following conditions.
Mo concentration: 20 g/L, Ni concentration: 6.5 g/L
Fe concentration: 3 g/L, sodium citrate: 150 g/L
pH 10.2 (30 ml/L of ammonia water added)
temperature: 30° C.
current density: 18 A/dm$^2$
plating time: 7 seconds
A deposition amount of the release layer formed under the above conditions was 1.89 mg/dm$^2$, and a composition of the release layer included 51.99 wt % Mo, 38.8 wt % Ni, and 5.55 wt % Fe.

6. Formation of Cu—Al Bonding Strength Improvement Layer
A Cu—Al bonding strength improvement layer, which is a layer improving bonding strength between the first ultra-thin copper foil and the Al layer, was formed, and a thickness of Cu was 0.1 μm.

Comparative Example 1

Comparative Example 1 was obtained under the same conditions as Example 1 except that a release layer was changed as follows.
3. Formation of Release Layer
A release layer was formed through Mo—Ni—Fe plating under the following conditions.
Mo concentration: 20 g/L, Ni concentration: 6.5 g/L
Fe concentration: 3 g/L, sodium citrate: 150 g/L
pH 10.2 (30 ml/L of ammonia water added)
temperature: 30° C.
current density: 3 A/dm$^2$
plating time: 7 seconds
A deposition amount of the release layer formed under the above conditions was 0.31 mg/dm$^2$, and a composition of the release layer included 23.42 wt % Mo, 69.81 wt % Ni, and 2.55 wt % Fe.

Comparative Example 2

Comparative Example 2 was obtained under the same conditions as Example 1 except that a release layer, a Cu—Al bonding strength improvement layer, and an Al layer were changed as follows.
3. Formation of Release Layer
A release layer was formed to have a deposition amount of 0.89 mg/dm$^2$.
6. Formation of Cu—Al Bonding Strength Improvement Layer
A Cu—Al bonding strength improvement layer was formed to have a bonding strength of about 8 gf/cm.
7. Formation of Al Layer
An Al layer was formed to have a thickness of 0.4 μm and a surface roughness of 1.5 μm.

Hereinafter, peel strength of Examples 1 to 4 and Comparative Examples 1 and 2, a surface roughness of an Al layer, and a bonding property with a semiconductor chip through a wire will be described with reference to Table 3.

TABLE 3

| No | treatment condition | roughness (Rz, μm) | bonding property through wire bonding | thickness (μm) of Cu—Al bonding strength improvement layer | Cu—Al bonding strength (gf/cm) | peel strength (gf/cm) | circuit formation |
| --- | --- | --- | --- | --- | --- | --- | --- |
| 1 | Al layer thickness: 0.5 μm, Rz: 1.5 μm, deposition amount of release layer: 1.07 mg/dm$^2$ | 1.5 | ⊚ | 0.03 | 214 | 19 | ⊚ |
| 2 | Al layer thickness: 1.0 μm, Rz: 1.5 μm, deposition amount of release layer: 1.07 mg/dm$^2$ | 1.5 | ⊚ | 0.03 | 178 | 19 | ⊚ |
| 3 | Al layer thickness: 0.5 μm, Rz: 3.0 μm, deposition amount of release layer: 1.07 mg/dm$^2$ | 3.0 | ⊚ | 0.03 | 194 | 19 | ○ |

TABLE 3-continued

| No | treatment condition | roughness (Rz, μm) | bonding property through wire bonding | thickness (μm) of Cu—Al bonding strength improvement layer | Cu—Al bonding strength (gf/cm) | peel strength (gf/cm) | circuit formation |
|---|---|---|---|---|---|---|---|
| 4 | Al layer thickness: 0.5 μm, Rz: 1.5 μm, deposition amount of release layer: 1.89 mg/dm² | 1.5 | ◎ | 0.1 | 214 | 8 | ◎ |
| Comparative Example 1 | Al layer thickness: 0.5 μm, Rz: 1.5 μm, deposition amount of release layer: 0.31 mg/dm² | 1.5 | ◎ | 0.05 | 169 | X | ◎ |
| Comparative Example 2 | Al layer thickness: 0.4 μm, Rz: 1.5 μm, deposition amount of release layer: 0.89 mg/dm² | 1.5 | ○ | 0.01 | 8 | 24 | X |

◎: very excellent
○: excellent
X: defective

Peel Strength and Bonding Property of Al Layer

In the case of Example 1, peel strength with copper layers above and below the Al layer was very excellent. In particular, after Example 1 was formed into a CCL, bonding strength between the Al layer and the ultra-thin copper foil layer was excellent. In the case of Examples 2 and 3, peel strength of the Al layer and a carrier was very excellent. In the case of Example 4, peel strength between the ultra-thin copper foil and a carrier was lowered due to a large deposition amount.

In the case of Comparative Example 1, peel strength of the Al layer and a carrier had a problem that the ultra-thin copper foil and the carrier were not peeled off due to a small deposition amount. The release layer was excellent, but bonding strength between the Al layer and the ultra-thin copper foil was weak, resulting in occurrence of a lifting phenomenon of the Al layer.

Surface Roughness of Al Layer

In the case of Examples 1, 2, and 4, a surface roughness of the Al layer was low, and thus, an etching rate was excellent. As a result, a fine pattern was obtained when a circuit was formed. In the case of Example 3, a surface roughness of the Al layer was high, and thus, an etching rate was lower as compared with Examples 1 and 2. As a result, a desired fine pattern could not be obtained when a circuit was formed.

In the case of Comparative Example 1, when such treatment was performed, a surface roughness of the Al layer was low, and thus, an etching rate was excellent. As a result, a fine pattern was obtained when a circuit was formed. However, in the case of Comparative Example 2, since the bonding strength between the Al layer and an ultra-thin copper foil was weak, due to a lifting phenomenon of the Al layer a circuit etchant was damaged, and thus, a circuit having a desired shape could not be obtained.

Bonding Property with Semiconductor Chip Through Wire

In the case of Examples 1 to 4, when a semiconductor substrate was manufactured using the carrier foil-attached ultra-thin copper foil and was electrically connected to a semiconductor chip using a wire (gold, aluminum, or the like) having a diameter of 25 μm to 70 μm, a bonding property between the Al layer and the wire was also excellent.

In the case of Comparative Example 1, since the carrier foil-attached ultra-thin copper foil was not peeled off, a semiconductor substrate could not be manufactured. In the case of Comparative Example 2, since the Al layer and the ultra-thin copper foil phase were peeled off, a semiconductor substrate could not be manufactured.

While the configuration and features of the present invention have been described with reference to the embodiments thereof, the present invention is not limited thereto. It will be apparent to those skilled in the art that various changes and modifications thereof may be made within the spirit and scope of the present invention, and therefore, it is to be understood that such changes and modifications belong to the scope of the appended claims.

The invention claimed is:

1. A carrier foil-attached copper foil having a structure in which:
   a carrier foil;
   a release layer;
   a first copper foil;
   a copper (Cu)-aluminum (Al) bonding strength improvement layer;
   a Cu diffusion prevention layer;
   an Al layer; and
   a second copper foil are sequentially stacked,
   wherein the release layer includes a first metal (A2) having a peeling property and second and third metals (B2, C2) which facilitate plating of the first metal (A2) and wherein the copper (Cu)-aluminum (Al) bonding strength improvement layer is a layer which improves bonding strength between the Al layer and the Cu diffusion prevention layer.

2. The carrier foil-attached ultra thin copper foil of claim 1, further comprising a Cu diffusion prevention layer between the Al layer and the second copper foil.

3. The carrier foil-attached copper foil of claim 1, wherein in a wire bonding process where the Al layer is connected to a bonding pad of a semiconductor chip using a bonding wire of a semiconductor chip, a thickness ($t_4$) of the Al layer and a thickness ($t_5$) of the bonding pad of a semiconductor chip satisfy an expression of about $0.0005 \leq t_4/t_5 \leq$ about 3.0.

4. The carrier foil-attached copper foil of claim 1, wherein in a wire bonding process where the Al layer is connected to a bonding pad of a semiconductor chip using a bonding wire of a semiconductor chip, a thickness ($t_4$) of the Al layer and a thickness (t6) of the bonding wire of a semiconductor chip satisfy an expression of about $0.0005 \leq t4/t6 \leq$ about 3.0.

5. The carrier foil-attached copper foil of claim 1, wherein a thickness (t7) of the Cu diffusion prevention layer and a thickness (t4) of the Al layer satisfy an expression of about $0.5 \leq t7/t4 \leq$ about 1.0.

6. The carrier foil-attached copper foil of claim 1, wherein a matte surface or a shiny surface of the carrier foil has a surface roughness of about 3.0 μm or less, and the Al layer is formed through electroplating or sputtering and has a surface roughness of about 3.0 μm or less.

7. The carrier foil-attached copper foil of claim 1, wherein the Al layer is formed through electroplating or sputtering, and a surface roughness (r3) of a matte surface or a shiny surface of the carrier foil and a surface roughness (r4) of the Al layer satisfy an expression of r4/r3≤about 3.0.

8. The carrier foil-attached copper foil of claim 1, wherein the first metal (A2) is molybdenum (Mo) or tungsten (W), and the second and third metals (B2, C2) are two different metals selected from the group consisting of iron (Fe), cobalt (Co), and nickel (Ni).

9. The carrier foil-attached copper foil of claim 1, wherein, in the release layer, a content (a2) of the first metal ranges from about 30 wt % to about 89 wt %, a content (b2) of the second metal ranges from about 10 wt % to about 60 wt %, and a content (c2) of the third metal ranges from about 1 wt % to about 20 wt %.

10. The carrier foil-attached copper foil of claim 1, wherein the sum of deposition amounts of the release layer ranges from about 50 μg/dm2 to about 10,000 μg/dm2.

11. The carrier foil-attached copper foil of claim 1, wherein the first copper foil and the second copper foil are formed through electroplating or sputtering.

12. A carrier foil-attached copper foil comprising having a structure in which:
    a carrier foil;
    a diffusion prevention layer;
    a release layer;
    an oxidation prevention layer;
    a first copper foil;
    a copper (Cu)-aluminum (Al) bonding strength improvement layer;
    a Cu diffusion prevention layer;
    an Al layer; and
    a second copper foil are sequentially stacked,
    wherein the release layer includes a first metal (A2) having a peeling property and second and third metals (B2, C2) which facilitate plating of the first metal (A2),
    the diffusion prevention layer and the oxidation prevention layer include at least one element selected from the group consisting of nickel (Ni), cobalt (Co), iron (Fe), chromium (Cr), molybdenum (Mo), tungsten (W), aluminum (Al), and phosphorus (P), and
    wherein the copper (Cu)-aluminum (Al) bonding strength improvement layer is a layer which improves bonding strength between the Al layer and the Cu diffusion prevention layer.

\* \* \* \* \*